(12) United States Patent
Huang et al.

(10) Patent No.: US 11,764,123 B2
(45) Date of Patent: Sep. 19, 2023

(54) SEMICONDUCTOR PACKAGE, INTEGRATED OPTICAL COMMUNICATION SYSTEM

(71) Applicant: Taiwan Semiconductor Manufacturing Company, Ltd., Hsinchu (TW)

(72) Inventors: Sung-Hui Huang, Yilan County (TW); Shang-Yun Hou, Hsinchu (TW); Tien-Yu Huang, Chiayi County (TW); Heh-Chang Huang, Hsinchu (TW); Kuan-Yu Huang, Taipei (TW); Shu-Chia Hsu, Hsinchu (TW); Yu-Shun Lin, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/857,166

(22) Filed: Jul. 4, 2022

(65) Prior Publication Data
US 2022/0336309 A1 Oct. 20, 2022

Related U.S. Application Data

(63) Continuation of application No. 16/881,004, filed on May 22, 2020, now Pat. No. 11,694,939.

(51) Int. Cl.
*H01L 23/31* (2006.01)
*H01L 25/16* (2023.01)

(52) U.S. Cl.
CPC ........ *H01L 23/3185* (2013.01); *H01L 25/167* (2013.01)

(58) Field of Classification Search
CPC .......................... H01L 23/3185; H01L 25/167
See application file for complete search history.

(56) References Cited

U.S. PATENT DOCUMENTS

| | | | | |
|---|---|---|---|---|
| 10,090,286 | B2 * | 10/2018 | Budd | H01L 27/1203 |
| 10,866,373 | B2 * | 12/2020 | Yu | G02B 6/4243 |
| 2008/0237841 | A1 * | 10/2008 | Arana | H01L 23/433 |
| | | | | 257/E23.11 |
| 2012/0241795 | A1 * | 9/2012 | Chang | G02B 6/4274 |
| | | | | 257/E33.071 |
| 2014/0029639 | A1 * | 1/2014 | Zarbock | G02B 6/4269 |
| | | | | 372/50.1 |
| 2014/0300004 | A1 * | 10/2014 | Choi | H01L 21/561 |
| | | | | 257/774 |
| 2014/0321803 | A1 * | 10/2014 | Thacker | G02B 6/4274 |
| | | | | 385/14 |
| 2017/0047312 | A1 * | 2/2017 | Budd | H01L 23/585 |
| 2017/0115458 | A1 * | 4/2017 | Mekis | G02B 6/4208 |

(Continued)

*Primary Examiner* — Eugene Lee
(74) *Attorney, Agent, or Firm* — JCIPRNET

(57) ABSTRACT

A semiconductor package includes a substrate, a stacked structure, an encapsulation material, a lid structure, and a coupler. The stacked structure is disposed over and bonded to the substrate. The encapsulation material partially encapsulates the stacked structure. The lid structure is disposed on the substrate, wherein the lid structure surrounds the stacked structure and covers a top surface of the stacked structure. The coupler is bonded to the stacked structure, wherein a portion of the coupler penetrates through and extends out of the lid structure.

20 Claims, 14 Drawing Sheets

(56) References Cited

U.S. PATENT DOCUMENTS

| | | | |
|---|---|---|---|
| 2017/0254968 A1* | 9/2017 | Ding | H01L 24/20 |
| 2018/0138101 A1* | 5/2018 | Yu | H01L 23/481 |
| 2019/0067157 A1* | 2/2019 | Lin | H01L 25/50 |
| 2019/0285804 A1* | 9/2019 | Ramachandran | G02B 6/421 |
| 2019/0295952 A1* | 9/2019 | Sikka | H01L 23/5381 |
| 2020/0105705 A1* | 4/2020 | Cheng | H01L 25/50 |
| 2020/0365544 A1* | 11/2020 | Chen | H01L 23/5383 |
| 2021/0043573 A1* | 2/2021 | Eid | H01L 35/32 |
| 2021/0096310 A1* | 4/2021 | Chang | H01L 21/565 |
| 2021/0132309 A1* | 5/2021 | Zhang | G02B 6/4249 |
| 2021/0166991 A1* | 6/2021 | Liu | G02B 6/30 |
| 2021/0225824 A1* | 7/2021 | Islam | G02B 6/4269 |
| 2021/0257288 A1* | 8/2021 | Meade | G02B 6/4243 |

* cited by examiner

SEMICONDUCTOR PACKAGE, INTEGRATED OPTICAL COMMUNICATION SYSTEM

CROSS-REFERENCE TO RELATED APPLICATION

This is a continuation application of patent application Ser. No. 16/881,004, filed on May 22, 2020. The entirety of the above-mentioned patent application is hereby incorporated by reference herein and made a part of this specification.

BACKGROUND

As data networks scale to meet ever-increasing bandwidth requirements, the shortcomings of copper data channels are becoming apparent. Signal attenuation and crosstalk due to radiated electromagnetic energy are the main impediments encountered by designers of such systems. They can be mitigated to some extent with equalization, coding, and shielding, but these techniques require considerable power, complexity, and cable bulk penalties while offering only modest improvements in reach and very limited scalability. Free of such channel limitations, optical communication has been recognized as the successor to copper links. However, contemporary optical communication systems are expensive and complicated in manufacturing process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
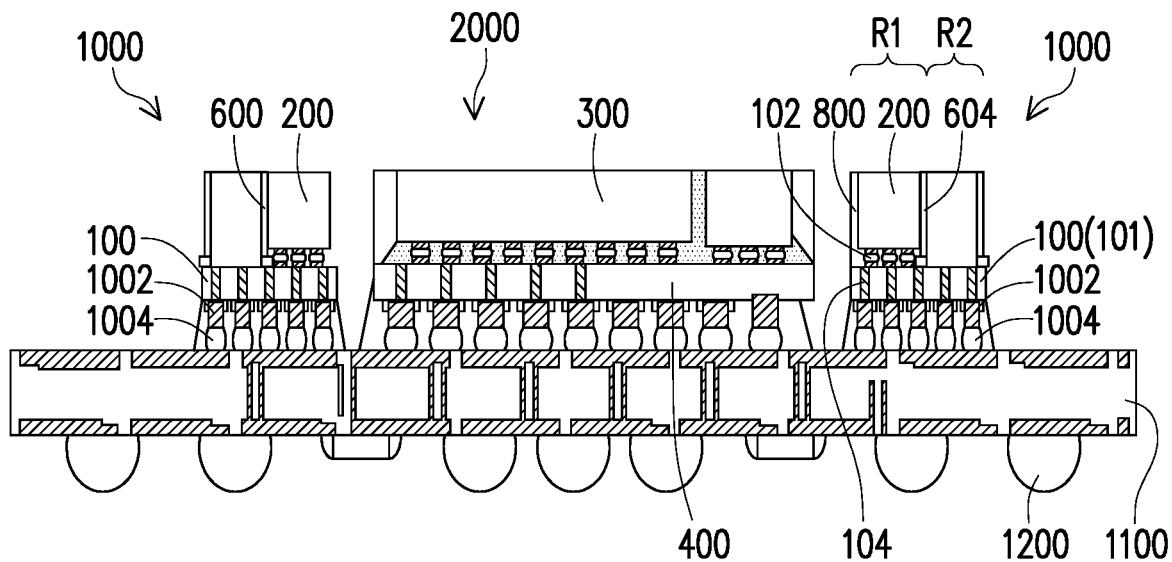
FIG. 1 to FIG. 3 are schematic cross-sectional views illustrating intermediate stages in a manufacturing of a semiconductor package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments will be described with respect to embodiments in a specific context, namely an integrated circuit package. Other embodiments may also be applied, however, to other electrically connected components, including, but not limited to, package-on-package assemblies, die-to-die assemblies, wafer-to-wafer assemblies, die-to-substrate assemblies, die-to-wafer assemblies, in assembling packaging, in processing substrates, interposers, or the like, or mounting input components, boards, dies or other components, or for connection packaging or mounting combinations of any type of integrated circuit or electrical component. Various embodiments described herein allow for packaging functional components (such as, for example, integrated circuit dies) of varying functionalities and dimensions (such as, for example, heights) in a same integrated circuit package. Various embodiments described herein may be applied to a chip-on-wafer-on-substrate (CoWoS) process and a chip-on-chip-on-substrate (CoCoS) process.

Figure 2:
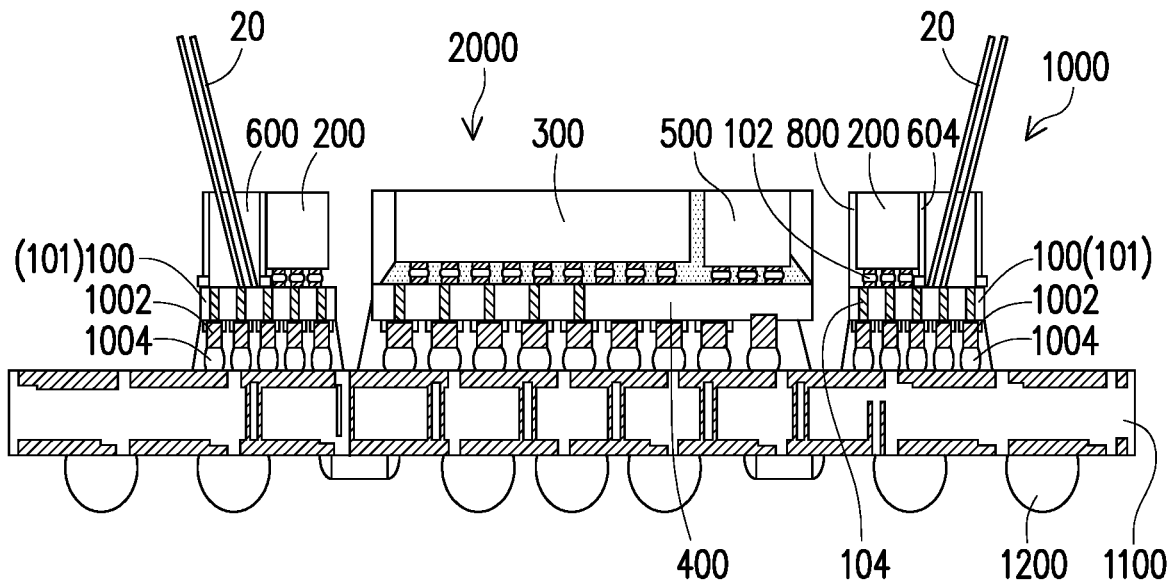
Figure 3:
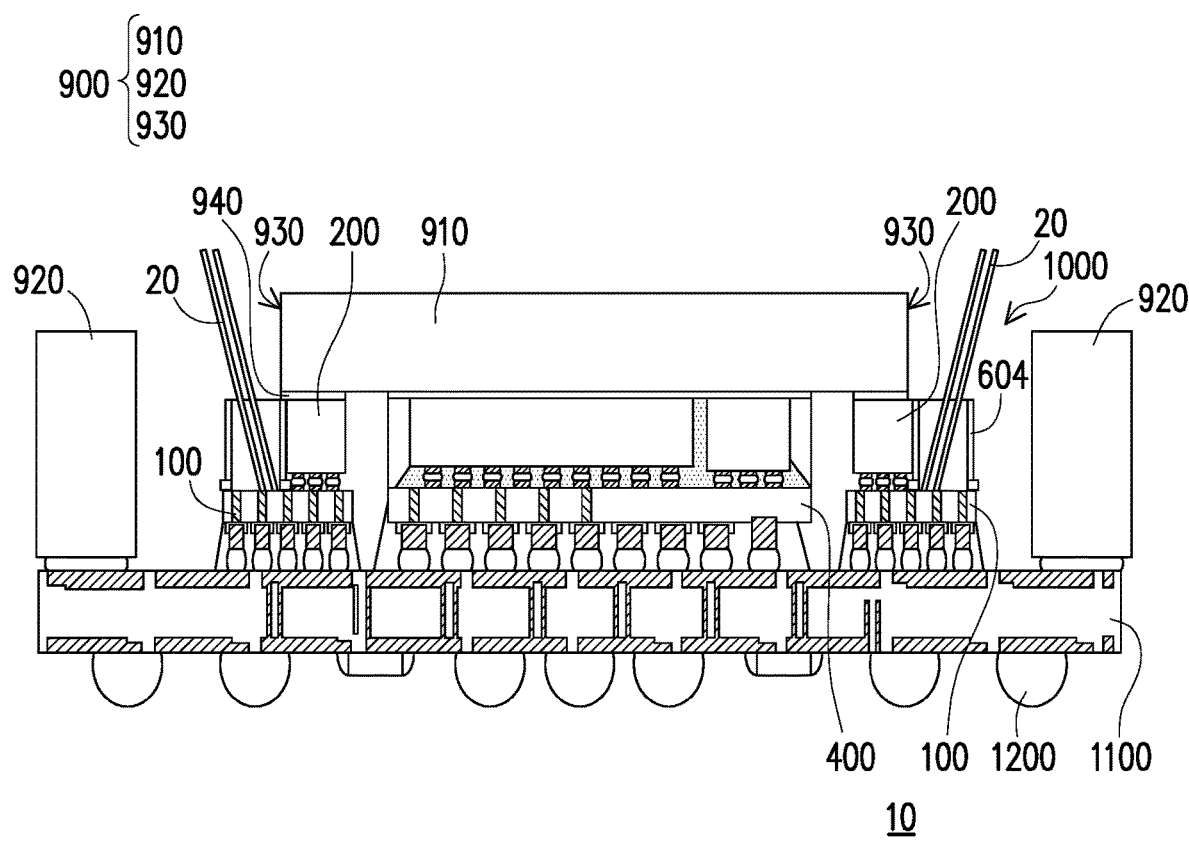

FIG. 1 to FIG. 3 are schematic cross-sectional views illustrating a manufacturing process of a semiconductor package in accordance with some embodiments of the disclosure. Referring to FIG. 1, a stacked structure 1000 is provided on a substrate 1100. In some embodiments, the stacked structure 1000 may include a first die 100 disposed over and bonded to the substrate 1100, and a second die 200 disposed over the substrate 1100 and electrically connected to the first die 100. In accordance with some embodiments of the present disclosure, the first die 100 may include a first region R1 and a second region R2 adjacent to each other.

In some exemplary embodiments, the second die 200 may be disposed over and bonded to the first die 100. The first die 100 may be further bonded to the substrate 1100 through conductive terminals 1002, 1004. In some alternative other embodiments, the first die 100 and the second die 200 may be bonded to an interposer in a side by side manner, and then be bonded to the substrate 110 through the interposer. In other embodiments, the first die 100 may be integrated in a workpiece 101, and the second die 200 may be disposed over and bonded to the workpiece 101 and electrically connected to the first die 100. In such embodiments, the workpiece 101 integrated with the first die 100 may be further bonded to the substrate 1100 through conductive terminals 1002, 1004 to form a "CoWoS (Chip on Wafer on Substrate) package". In some embodiments, the substrate 1100 may be a printed circuit board including a plurality of conductive balls 1200 (e.g., solder balls or the like) formed on the bottom surface thereof. In other words, the substrate 1100 is a ball grid array (BGA) circuit substrate, but the disclosure is not limited thereto.

In some embodiments, the workpiece 101 may be a singulated die, such as an interposer die, for example. In other embodiments, the workpiece 101 may be a wafer, such as an interposer wafer, for example. In some embodiments where the workpiece 101 is an interposer wafer or an interposer die, the workpiece 101 includes a semiconductor substrate and interconnects, such as through semiconductor vias (TSV) 104 and lines (not illustrated) within the semiconductor substrate. In some embodiments, the semiconductor substrate of the first die 100 may be made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the semiconductor substrate has a plurality of semiconductor devices (e.g., transistors, capacitors, photodiodes, combinations thereof, or the like) and a plurality of optical devices (e.g. waveguides, filters, photodiodes, light-emitting diodes, combinations thereof, or the like) formed therein. In some embodiments, the interconnects may include one or more conductive materials, such as copper, a copper alloy, silver, gold, tungsten, tantalum, aluminum, a combination thereof, or the like.

In some embodiments, the first die 100 may be a photonic integrated circuit die, which may include a CMOS chip with active and passive optical devices such as waveguides, modulators, photodetectors, optical couplers, combiners, etc. In some embodiments, the semiconductor devices may be formed in the first region R1 and the optical devices are formed in the second region R2. As such, the second region R2 of the first die 100 may be adapted to transmit/receive optical signals. However, the disclosure is not limited thereto. In some alternative embodiments, the semiconductor devices and the optical devices may be respectively formed in both of the first region R1 and the second region R2. The functionalities supported by the photonic integrated circuit die may include photo-detection, optical modulation, optical routing, and optical interfaces for high-speed I/O and optical power delivery.

In accordance with some embodiments of the present disclosure, the second die 200 is placed on, for example, a first region R1 of the first die 100 shown in FIG. 1. In some embodiments, the second die 200 may be placed through a pick-and-place process. In some embodiments, a dam structure 604 is disposed on the first die 100 and may surround, for example, the second region R2. It should be noted that since the first die 100 serves as a carrier for supporting the second die 200, the first die 100 may be referred to as an "interposer" in some embodiments.

In some embodiments, the second die 200 may be an electronic integrated circuit die. In such embodiments, the photonic integrated circuit die 100 may have the function of receiving optical signals, transmitting the optical signals inside the photonic integrated circuit die 100, transmitting the optical signals out of the photonic integrated circuit die 100, and communicating electronically with the electronic integrated circuit die 200. For example, the electronic integrated circuit die 200 may include one or more electronic complementary metal-oxide-semiconductor (CMOS) chips that provide the required electronic functions of the integrated optical communication system. The electronic integrated circuit die 200 may include a single chip or a plurality of die coupled to the photonic integrated circuit die 100. The electronic integrated circuit die 200 may include trans-impedance amplifiers (TIAs), low-noise amplifiers (LNAs), and control circuits for processing optical signals in the photonic integrated circuit die 100. For example, the electronic integrated circuit die 200 may include a driver circuitry for controlling optical modulators in the photonic integrated circuit die 100 and variable gain amplifiers for amplifying electrical signals received from photodetectors in the photonic integrated circuit die 100. By incorporating photonics devices in the photonic integrated circuit die 100 and electronic devices in the electronic integrated circuit die 200, the CMOS processes for each chip may be optimized for the type of devices incorporated.

As illustrated in FIG. 1, the second die 200 is placed such that the conductive pads of the second die 200 are attached to a plurality of connectors 102 on the first die 100. For example, each of conductive pads is directly in contact with the corresponding connector on the first die 100. After the second die 200 is placed on the connectors 102, a reflow process may be performed to fix the conductive pads onto the connectors 102. As such, electrical connection between the second die 200 and the first die 100 may be realized. That is, the connectors 102 are disposed between the first die 100 and the second die 200, and the second die 200 is electrically connected to the first die 100 through the connectors 102.

Figure 5:
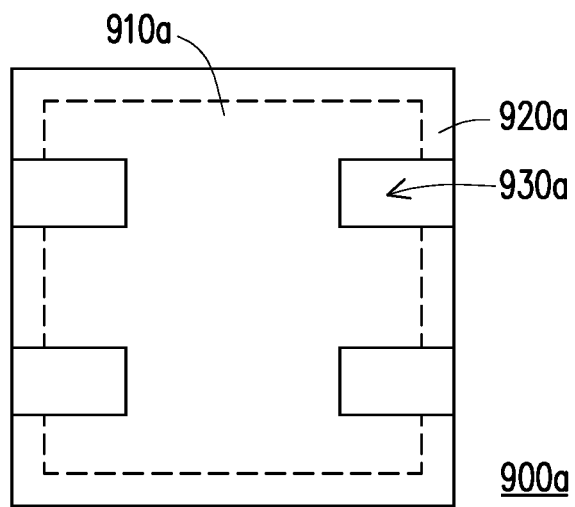
FIG. 5 schematically illustrates a top view of a lid structure in accordance with some embodiments of the disclosure.

Referring to FIG. 1 and FIG. 5, in some embodiments, each of the connectors 102 may include a conductive pillar, as the conductive pillar 1021 illustrated in FIG. 5, for example, and a conductive bump 1022, as the conductive bump 1022 illustrated in FIG. 5, for example, disposed on the conductive pillar 1021. The conductive pillars 1021 are disposed corresponding to the TSVs 104. In some embodiments, the connectors 102 are referred to as "micro bumps."

In some embodiments, an underfill layer, as the underfill layer UF1 illustrated in FIG. 5, for example, is formed between the first die 100 and the second die 200. For example, the underfill layer UF1 may be formed to wrap around the connectors 102 and the conductive pads 201 to protect these elements. In some embodiments, the underfill layer UF1 may be optional.

In some embodiments, an encapsulation material 800 is provided on the first die 100 to partially encapsulate the stacked structure 1000. In some embodiments, the encapsulation material 800 may laterally encapsulate the second die 200. In some embodiments, the encapsulation material 800 is a molding compound, a molding underfill, a resin (such as epoxy), or the like. In some embodiments, the encapsulation material 800 includes fillers. The fillers may be particles made of silica, aluminum dioxide, or the like. The encapsulation material 800 may be formed by a molding process, such as a compression molding process. As illustrated in FIG. 1, the top surface of the encapsulation material 800 and the top surface of the second die 200 are substantially coplanar.

In some embodiments, the substrate 1100 may include a printed circuit board (PCB) or the like. In some embodiments, an underfill layer may be optionally formed on the substrate 1100 to protect the redistribution structure and the conductive terminals 1002, 1004. In some embodiments, the package structure illustrated in FIG. 1 to FIG. 3 may be referred to as a "CoWoS (Chip on Wafer on Substrate) package." That is, in some embodiments, the first die 100 may serve as an interposer. However, the disclosure is not limited thereto.

Referring to FIG. 2, a coupler 20 is bonded to the stacked structure 1000. In some embodiments, the coupler 20 may be a photonic device including, for example, an optical coupler, an optical fiber, a laser emitter, or the like. In some embodiments, the coupler 20 may be bonded to the second region R2 surrounded by the dam structure 604. In some embodiments, the dam structure 604 isolate the coupler 20 from the encapsulation material 800 and exposes the optical device embedded in the first die 100. As such, upon bonded to first die, the coupler 20 is able to optically communicate with the optical devices in the first die 100, thereby achieving photonic applications. In the present embodiment, the optical coupler may be grating couplers, which include a plurality of grooves parallel to one another, but the disclosure is not limited thereto. The optical fibers may be aligned at an angle substantially normal to the surface of the photonic integrated circuit die 100 to optimize coupling efficiency, for example. In an alternative embodiment, the optical couplers may be edge couplers, which include a plurality of grooves parallel to one another and extended to an edge of the coupling surface of the photonic integrated circuit die 100, and are configured for coupling of light between planar waveguide circuits and optical fibers. The disclosure is not limited thereto.

In accordance with some embodiments of the present disclosure, a third die 300 may also be bonded to the substrate 1100 and electrically connected to the second die 200. In some embodiments, the third die 300 may be firstly bonded to, for example, an interposer 400, and then the stacked structure including the third die 300 and the interposer 400 is bonded to the substrate 1100 with the stacked structure 1000 in a side by side manner. In some embodiments, the third die 300 may be a system on chip (SoC), which include CPU, GPU, FPGA or other suitable high performance integrated circuit. In some embodiments, the second die 200 may be the electronic integrated circuit die including a driver die with circuitry for driving the photonics devices in the first die 100 (photonic integrated circuit die). Accordingly, the electronic integrated circuit die 200 may receive electronic signals from the SoC 300 via the photonic integrated circuit die 100 and use the received signals to subsequently drive photonic devices in the photonic integrated circuit die 100. In this manner, the electronic integrated circuit die 200 provides the driver circuitry as opposed to integrating driver circuitry in the SoC 300. However, the exemplary embodiment is not intended to limit the disclosure.

In some embodiments, the third die 300 is electrically connected to the interposer 400 through a micro-bumping process, that is, a plurality of bumps of the third die 300 are bonded to the interposer 400. In some exemplary embodiments, a memory die 500 may also be bonded to the interposer 400 and electrically connected to the third die 300. The memory die 500 may be, for example, a high bandwidth memory die. In some embodiments, an under fill is further formed between the third die 300 and the interposer 400, for example. It should be noted that since the third die 300 is bonded to the substrate 1100 through the interposer 400, such package structure including the third die 300, and the interposer may be referred to as a "package structure 2000" in some embodiments. However, the disclosure is not limited thereto. In other embodiments, the third die 300 may be bonded to the workpiece 101 where the second die 200 is bonded. In other words, the second die 200 and the third die 300 (and the memory die 500, if applicable) are disposed over and bonded to the workpiece 101 in a side by side manner.

Figure 4:
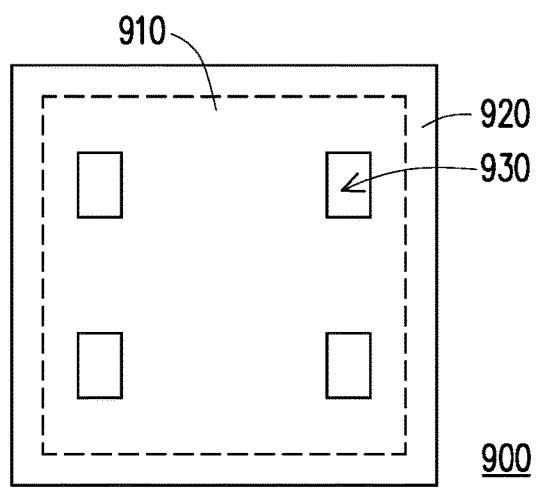
FIG. 4 schematically illustrates a top view of a lid structure in accordance with some embodiments of the disclosure.

FIG. 4 schematically illustrates a top view of a lid structure in accordance with some embodiments of the disclosure. Referring to FIG. 3 and FIG. 4, in some exemplary embodiments, a lid structure 900 is disposed on the substrate 1100. In some embodiments, the lid structure 900 may be attached to the substrate 1100 on a same side as the stacked structure 1000 bonded to, such that the lid structure 900 encloses the stacked structure 1000. In accordance with some embodiments of the present disclosure, the lid structure 900 is attached to the substrate 1100 through adhesive. In some embodiments, the lid structure 900 surrounds the stacked structure 1000 and covers a top surface of the stacked structure 1000. In the present embodiment, the lid structure 900 at least partially covers the top surface of the second die 200. In the embodiments with the package structure 2000, the lid structure 900 surrounds the stacked structure 1000 (the first die 100 and the second die 200) and the package structure 2000 (the third die 300), and covers the top surfaces of the second die 200 and the third die 300. In some embodiments, the optical fiber of the coupler 20 penetrates through and extends out of the lid structure 900.

For example, the lid structure 900 includes a cover portion 910, a side portion 920, and an opening 930. The side portion 920 may be an annular side wall surrounds the first die 100, the second die 200 and the third die 300, and the cover portion 920 connects the side portion 920 and covers the top surfaces of the second die 200 and the third die 300. In the present embodiment, the openings 930 are located on the cover portion 910, as it is shown in FIG. 4, for the optical fibers of the coupler 20 to be extended therefrom. However, the disclosure is not limited thereto. The location of the opening 930 may be adjusted according to the location and the arrangement of the optical fiber. Accordingly, the optical fiber of the coupler 20 may extends out of the lid structure 900 through the openings 930 for further connection. In other embodiments, the coupler 20 may be any other suitable coupler bonded to the first die 100, and the portion of the coupler that is extended out of the lid structure 900 may be a wire, or the like, for further connection. The disclosure is not limited thereto.

Figure 6:
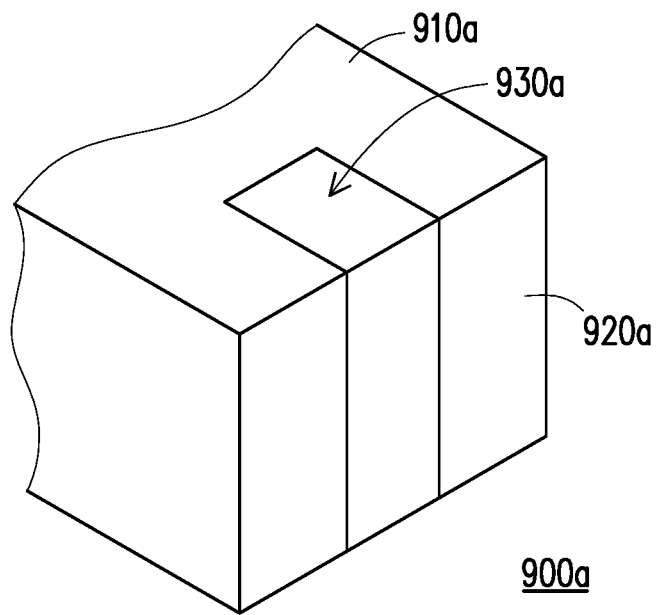
FIG. 6 schematically illustrates a partial perspective view of a lid structure in accordance with some embodiments of the disclosure.

FIG. 5 schematically illustrates a top view of a lid structure in accordance with some embodiments of the disclosure. FIG. 6 schematically illustrates a partial perspective view of a lid structure in accordance with some embodiments of the disclosure. In other embodiments, the openings may also be located on the side portion 920 or on the edge of the cover portion 910 and extended toward the side portion 920. For example, referring to FIG. 5 and FIG. 6, in the present embodiments, the openings 930a are located on the edge of the cover portion 910a and extended toward the side portion 920a, so the optical fibers of the optical coupler 20 may extend out from the top and/or the side of the lid structure 900a depending on the arrangement of the optical coupler 20. In the present embodiment, the opening 930a forms a slit on the side portion 920a, which means the opening 930a is extended from the top of the side portion 920a for connecting the cover portion 910a toward the bottom of the side portion 920a. As such, the opening 930a may accommodate variety of formations of couplers 20, such as grating coupler, edge coupler, or the like. In some alternative embodiments, the opening may not be extended all the way down to the bottom of the side portion 920a. The disclosure is not limited thereto.

Owing to the arrangement of the lid structure 900 bonded to the substrate 110 and covering the top surface of the stacked structure 1000, warpage of the substrate 1100 and the attached stacked structure 1000 may be prevented or at least significantly improved. In some embodiments, the lid structure 900 may include an insulating material, stainless steel, brass, copper, a combination thereof, or the like. In some embodiments, the lid structure 900 may be in physical contacts with the top surfaces of the second die 200 and the third die 300. In other embodiments, a thermal interface material 940 may be disposed between the lid structure 900 and the top surface of the stacked structure 1000 (the second die 200) to further improve the heat dissipation efficiency of the semiconductor package 10. That is to say, by providing the lid structure 900 on top of the semiconductor package 10, not only the warpage but the heat dissipation of the semiconductor package 10 can also be improved.

FIG. 7 to FIG. 13 are schematic cross-sectional views illustrating intermediate stages in a manufacturing of a semiconductor package in accordance with some embodiments of the disclosure. There are many different arrangements and manufacturing methods can be applied to the stacked structure of the semiconductor package in the disclosure. FIG. 7 to FIG. 13 merely illustrating one of the embodiments for manufacturing the stacked structure 1000 shown in FIG. 3. It should be well understood that the manufacturing processes illustrated in FIG. 7 to FIG. 12 are performed prior to the manufacturing process illustrated in FIG. 1 in order to provide the stacked structure 1000 on the substrate 1100.

Figure 7:
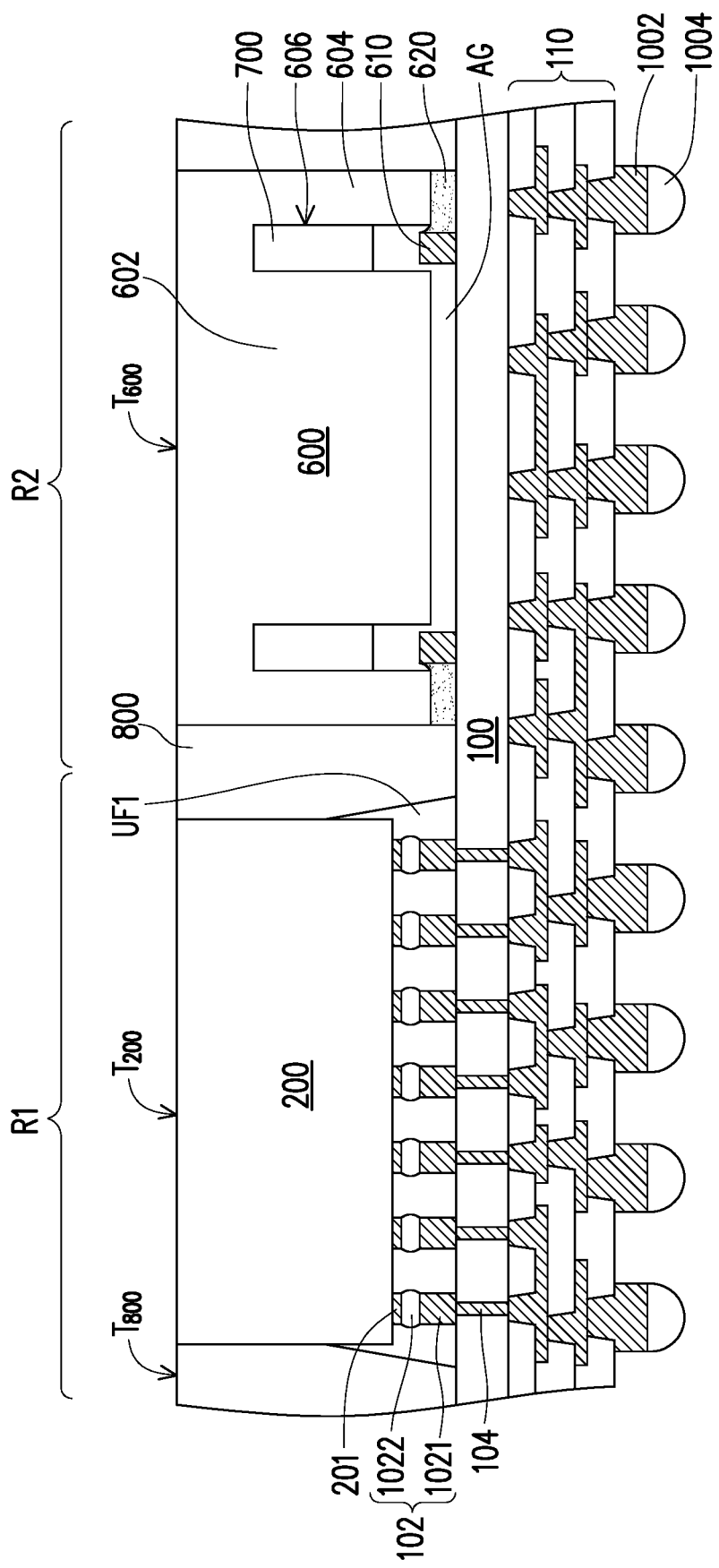
FIG. 7 to FIG. 13 are schematic cross-sectional views illustrating intermediate stages in a manufacturing of a semiconductor package in accordance with some embodiments of the disclosure.

Referring to FIG. 7, in some embodiments, the second die 200 and a dummy die 600 are placed on the first die 100 shown in FIG. 7. In some embodiments, the second die 200 and the dummy die 600 may be placed through a pick-and-place process. In some embodiments, the dummy die 600 may be electrically floating. In some embodiments, the second die 200 and the dummy die 600 are disposed side by side over the first die 100. For example, the second die 200 is placed in the first region R1 and the dummy die 600 is placed in the second region R2. It should be noted that since the first die 100 serves as a carrier for supporting the second die 200 and the dummy die 600, the first die 100 may be referred to as a "workpiece" in some embodiments.

In some embodiments, the second die 200 is placed such that the conductive pads 201 of the second die 200 are attached to the connectors 102. For example, each of conductive pads 201 is directly in contact with the corresponding conductive bump 1022. After the second die 200 is placed on the connectors 102, a reflow process may be performed to fix the conductive pads 201 onto the conductive bumps 1022. As such, electrical connection between the second die 200 and the first die 100 may be realized through the connectors 200. In some embodiments, the underfill layer UF1 is formed between the first die 100 and the second die 200. For example, the underfill layer UF1 may be formed to wrap around the connectors 102 and the conductive pads 201 to protect these elements. In some embodiments, the underfill layer UF1 may be optional.

In some embodiments, the dummy die 600 is a bulky semiconductor substrate having a trench 606 formed therein. In some embodiments, the trench 606 exhibits a ring shape from the top view. The trench 606 divides the semiconductor substrate into the inner portion 602 and the outer portion 604. As illustrated in FIG. 7, a depth of the trench 606 is smaller than a thickness of the dummy die 600. That is, the trench 606 does not penetrate through the dummy die 600. Therefore, at this stage, the inner portion 602 and the outer portion 604 are connected to each other by the bottom portion of the semiconductor substrate. In some embodiments, the semiconductor substrate may be made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the dummy die 600 may be free of active components and passive components. Alternatively, the dummy die 600 may include active components and passive components with functions of these components being disabled.

In some embodiments, the trench 606 is partially filled with a dielectric material 700. For example, the dielectric material 700 covers a bottom surface and a portion of sidewalls of the trench 606. On the other hand, another portion of the sidewalls of the trench 606 is not being covered by the dielectric material 700. In some embodiments, the dielectric material 700 includes polyimide, epoxy resin, acrylic resin, phenol resin, benzocyclobutene (BCB), polybenzooxazole (PBO), or any other suitable polymer-based dielectric materials.

In some embodiments, before the dummy die 600 is placed on the first die 100, a dam 610 is formed in the second region R2. In some embodiments, the connectors 102 in the first region R1 and the dam 610 in the second region R2 may be formed simultaneously. For example, the conductive pillars 1021 of the connectors 102 and the dam 610 may be formed by the same process step. That is, the conductive material and the seed layer formed in the first region R1 is referred to as the conductive pillars 1021 and the conductive material and the seed layer formed in the second region R2 is referred to as the dam 610. As illustrated in FIG. 7, the conductive bumps 1022 do not form in the second region R2. However, the disclosure is not limited thereto. In some alternative embodiments, the conductive bumps 1022 may be formed in both of the first region R1 and the second region R2. The dam 610 may have the same geometry as that of the connectors 102 in the cross-sectional view. In some embodiments, a material of the dam 610 includes copper, copper alloy, titanium-copper alloy, solder, other suitable choice of materials, or a combination thereof.

In some embodiments, an adhesive layer 620 is formed on the first die 100. In some embodiments, the adhesive layer 620 is dispensed in the second region R2. In some embodiments, the adhesive layer 620 is a liquid-type adhesive layer. For example, the adhesive layer 620 includes a liquid-type die attach film (DAF) or a liquid-type film over wire (FOW). In some embodiments, the liquid-type adhesive layer has a viscosity lower than that of the conventional film-type adhesive layer. In some embodiments, the adhesive layer 620 is free of filler. Unlike the conventional film-type adhesive layer, the liquid-type adhesive layer may be formed in any desired pattern through dispending methods. For example, the adhesive layer 620 may be formed by screen printing, inkjet printing, three-dimensional printing, or the like.

In some embodiments, the dummy die 600 may be placed over the first die 100 through the following steps. First, the trench 606 of the dummy die 600 and the dam 610 are aligned. Thereafter, the dummy die 600 is being moved downward to fit the dam 610 into the trench 606 of the dummy die 600. That is, the dam 610 is inserted into the trench 606. Meanwhile, the outer portion 604 of the dummy die 600 is attached to the adhesive layer 620. In other words, the adhesive layer 620 is sandwiched between the first die 100 and the dummy die 600. Subsequently, the dummy die 600 is pressed against the adhesive layer 620 to ensure the outer portion 604 of the dummy die 600 is securely fixed onto the adhesive layer 620. Thereafter, the adhesive layer 620 is cured to strengthen the adhesion between the first die 100 and the dummy die 600. Since the dummy die 600 is being pressed against the adhesive layer 620 before curing, portions of the adhesive layer 620 would be squeezed laterally and may be stopped by the dam 610. That is, the dam 610 not only serves as an alignment mark for aligning the first die 100 and the dummy die 600, but also functions as a barrier structure for stopping the flooding of the adhesive layer 620.

In some embodiments, after placing the second die 200 and the dummy die 600 on the first die 100, an encapsulation material 800 is formed on the first die 100 to encapsulate the second die 200 and the dummy die 600. In some embodiments, the encapsulation material 800 is a molding compound, a molding underfill, a resin (such as epoxy), or the like. In some embodiments, the material of the encapsulation material 800 is different from the material of the adhesive layer 620. The encapsulation material 800 may be formed by a molding process, such as a compression molding process. In some embodiments, the second die 200 and the dummy die 600 are completely encapsulated by the encapsulation material 800. In other words, the second die 200 and the dummy die 600 are not revealed by the encapsulation material 800. As illustrated in FIG. 7, the encapsulation material 800 does not fill into the air gap AG and the trench 606 of the dummy die 600.

In some embodiments, a portion of the encapsulation material 800 is removed to expose the top surface $T_{200}$ of the second die 200 and the top surface $T_{600}$ of the dummy die 600. In some embodiments, the portion of the encapsulation material 800 may be removed through a grinding process, such as a mechanical grinding process, a chemical mechanical polishing (CMP) process, or another suitable mechanism. After the encapsulation material 800 is grinded, the encapsulant 800 laterally encapsulates the second die 200 and the dummy die 600. The top surface $T_{800}$ of the encapsulant 800, the top surface $T_{200}$ of the second die 200, and the top surface $T_{600}$ of the dummy die 600 are substantially coplanar.

Figure 8:
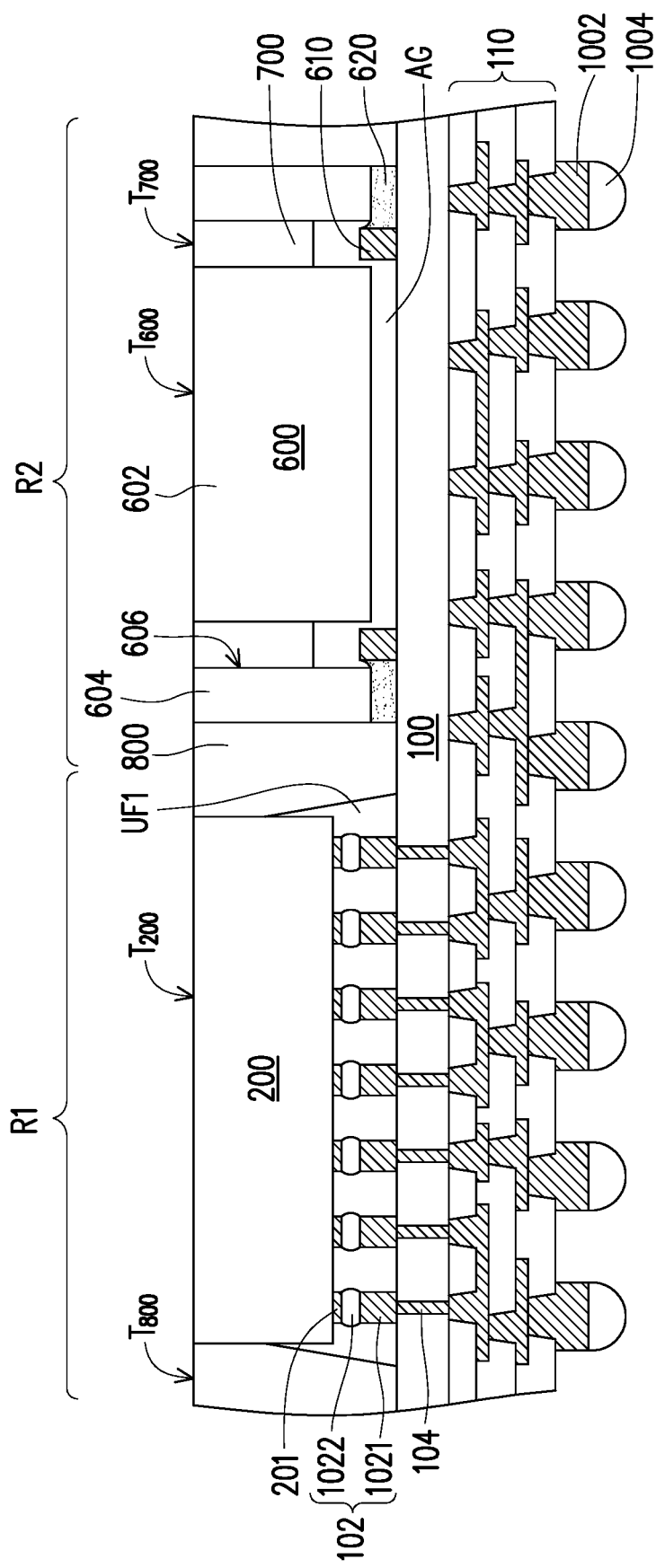

Then, referring to FIG. 8, the structure illustrated in FIG. 7 is placed on a tape TP, and a thickness of the second die 200, a thickness of the dummy die 600, and a thickness of the encapsulant 800 are reduced. In some embodiments, the encapsulant 800, the second die 200, and the dummy die 600 are grinded until the dielectric material 700 filled in the trench 606 of the dummy die 600 is revealed. That is, a portion of the encapsulant 800, a portion of the second die 200, and a portion of the dummy die 600 are removed. In some embodiments, the grinding process may include a mechanical grinding process, a chemical mechanical polishing (CMP) process, or another suitable mechanism. In some embodiments, after the dielectric material 700 is revealed, the second die 200, the dummy die 600, the encapsulant 800, and the dielectric material 700 may be further grinded to reduce the overall thickness of the subsequently formed package structure. After the grinding process, a top surface $T_{700}$ of the dielectric material 700, the top surface $T_{800}$ of the encapsulant 800, the top surface $T_{200}$ of the second die 200, and the top surface $T_{600}$ of the dummy die 600 are substantially coplanar. On the other hand, the trench 606 penetrate through the dummy die 600. As illustrated in FIG. 8, at this stage, the inner portion 602 and the outer portion 604 of the dummy die 600 are spaced apart from each other. For example, the dielectric material 700 is sandwiched between the inner portion 602 and the outer portion 604 of the dummy die 600 to separate these two elements.

Figure 9:
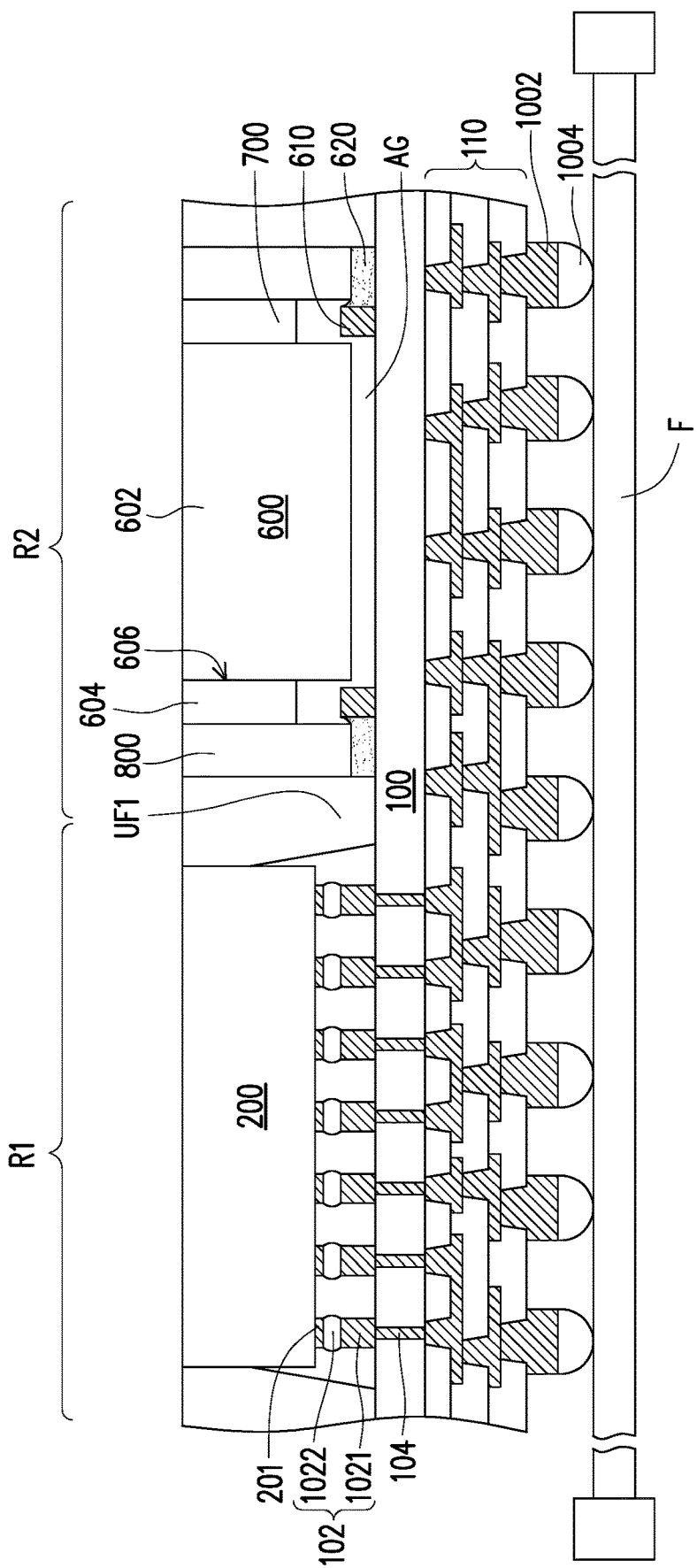

Referring to FIG. 9, the tape TP is removed and the structure illustrated in FIG. 8 is mounted on a frame structure F for further processing. For example, a cleaning process may be performed to remove impurities or residues derived from the previous process steps.

Figure 10:
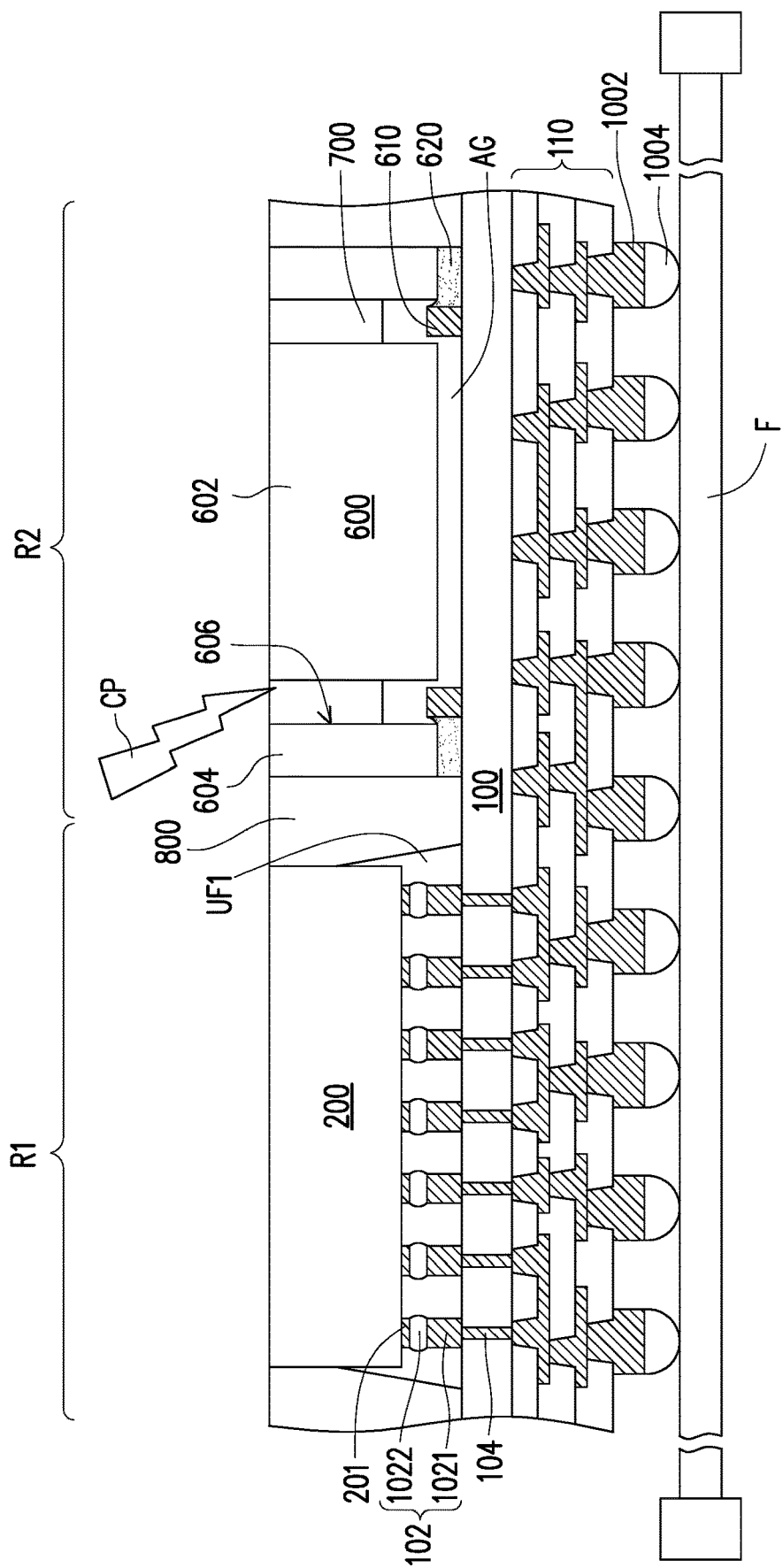

Referring to FIG. 10, a cutting process CP is performed on the exposed dielectric material 700. In some embodiments, the cutting process CP may include a laser drilling process, a mechanical drilling process, a combination thereof, or any other suitable dicing processes. In some embodiments, a portion of the dielectric material 700 is removed during the cutting process CP. For example, the dielectric material 700 may be cut through such that a portion of the dielectric material 700 remains on the sidewalls of the outer portion 604 while another portion of the dielectric material 700 remains on the sidewalls of the inner portion 602. After the cutting process CP, the inner portion 602 and the outer portion 604 are disconnected from each other.

Figure 11:
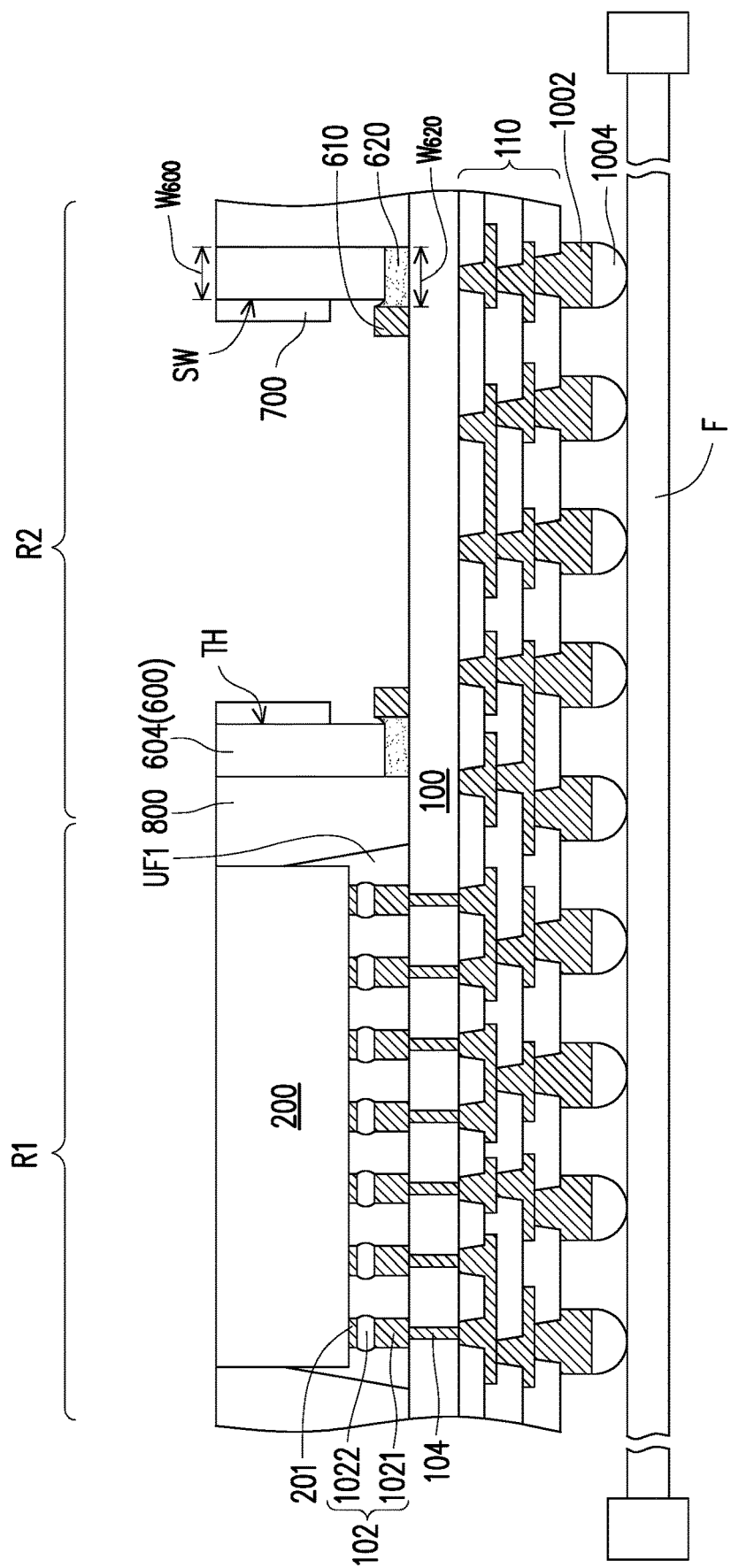

Referring to FIG. 11, the inner portion 602 and the portion of the dielectric material 700 remains on the sidewalls of the inner portion 602 are removed to form a through hole TH in the dummy die 600. As mentioned above, the region directly underneath the inner portion 602 includes the air gap AG and is free of adhesive layer. As such, the adhesive layer 620 is able to securely fix the outer portion 604 of the dummy die 600 while allowing the inner portion 602 of the dummy die 600 to be easily removed. In some embodiments, since the inner portion 602 is removed and the outer portion 604 remains, the outer portion 604 may be referred to as the dam structure 604 in some embodiments. As illustrated in FIG. 11, the through hole TH of the dummy die 600 exposes portions of the second region R2 of the first die 100. For example, the optical devices formed in the second region R2 of the first die 100 may be exposed by the through hole TH. In some embodiments, the remaining dielectric material 700 partially covers sidewalls SW of the through hole TH. As illustrated in FIG. 11, the dam 610 are located in the through hole TH of the dummy die 600. Referring to FIG. 10 and FIG. 11, since the through hole TH is obtained by removing the inner portion 602 and portions of the dielectric material 700 located in the trench 606, the sidewalls SW of the through hole TH correspond to the sidewall of the trench 606. As illustrated in FIG. 11, a width $W_{620}$ of the adhesive layer 620 is greater than a width $W_{600}$ of dummy die 600. However, the disclosure is not limited thereto. In some alternative embodiments, the width $W_{620}$ of the adhesive layer 620 may be substantially equal to or smaller than the width $W_{600}$ of the dummy die 600.

Figure 12:
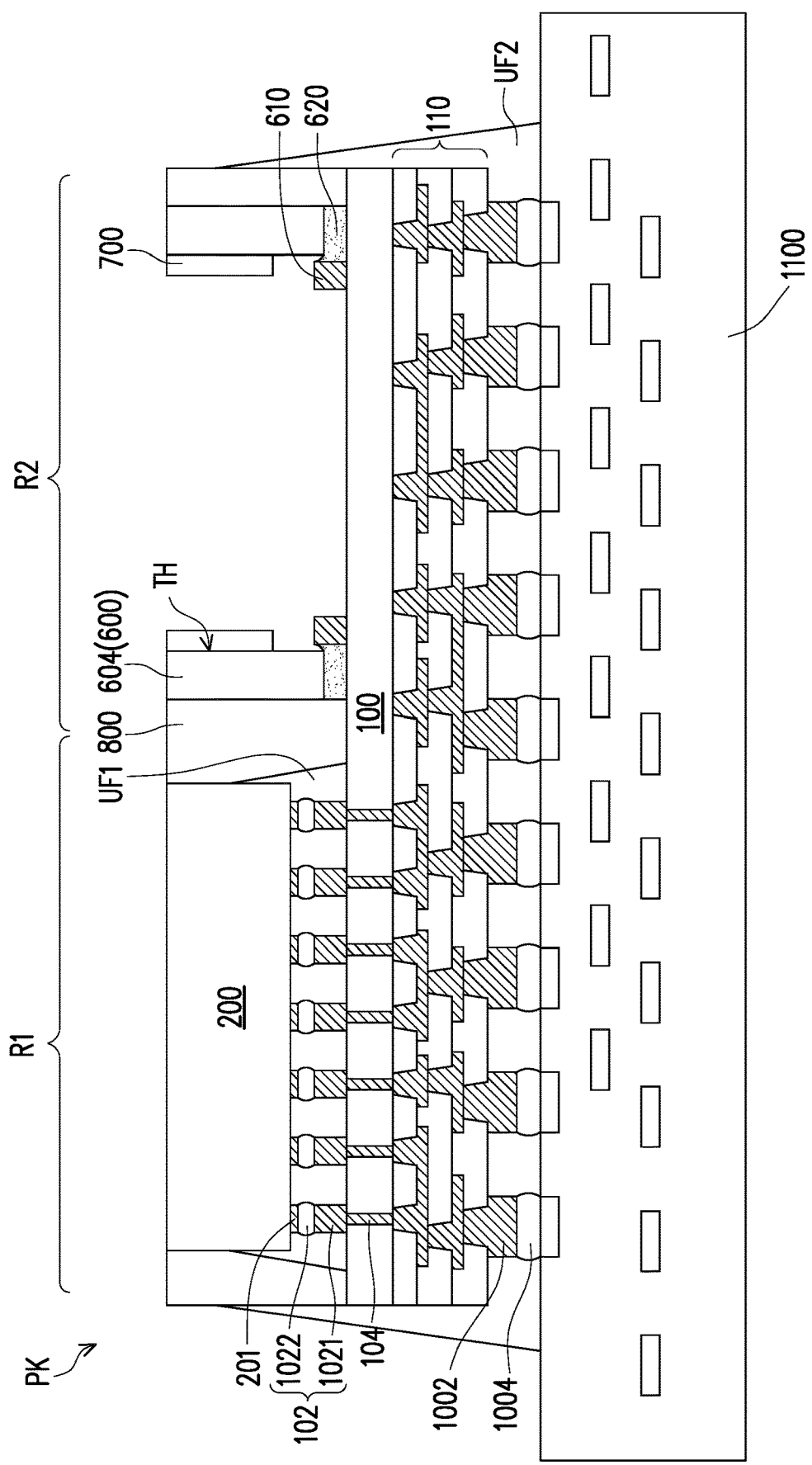

Referring to FIG. 12, the frame structure F is removed and a singulation process is performed on the structure illustrated in FIG. 11. In some embodiments, the dicing process or the singulation process typically involves dicing with a rotating blade or a laser beam. In other words, the dicing or singulation process is, for example, a laser cutting process, a mechanical cutting process, or other suitable processes. Thereafter, the singulated structure is placed on a substrate 1100 to obtain the package structure 10, for example, as the package structure shown in FIG. 1 and FIG. 12. In some embodiments, the substrate 1100 may include a printed circuit board (PCB) or the like. In some embodiments, an underfill layer UF2 may be optionally formed on the substrate 1100 to protect the redistribution structure 110 and the conductive terminals 1002, 1004. In some embodiments, the package structure PK illustrated in FIG. 12 may be referred to as a "CoWoS (Chip on Wafer on Substrate) package." That is, in some embodiments, the first die 100 may serve as an interposer. However, the disclosure is not limited thereto. In some alternative embodiments, the process steps illustrated in FIG. 7 to FIG. 12 may be adapted to fabricate other type of packages, such as integrated fan-out (InFO) packages or the like.

Figure 13:
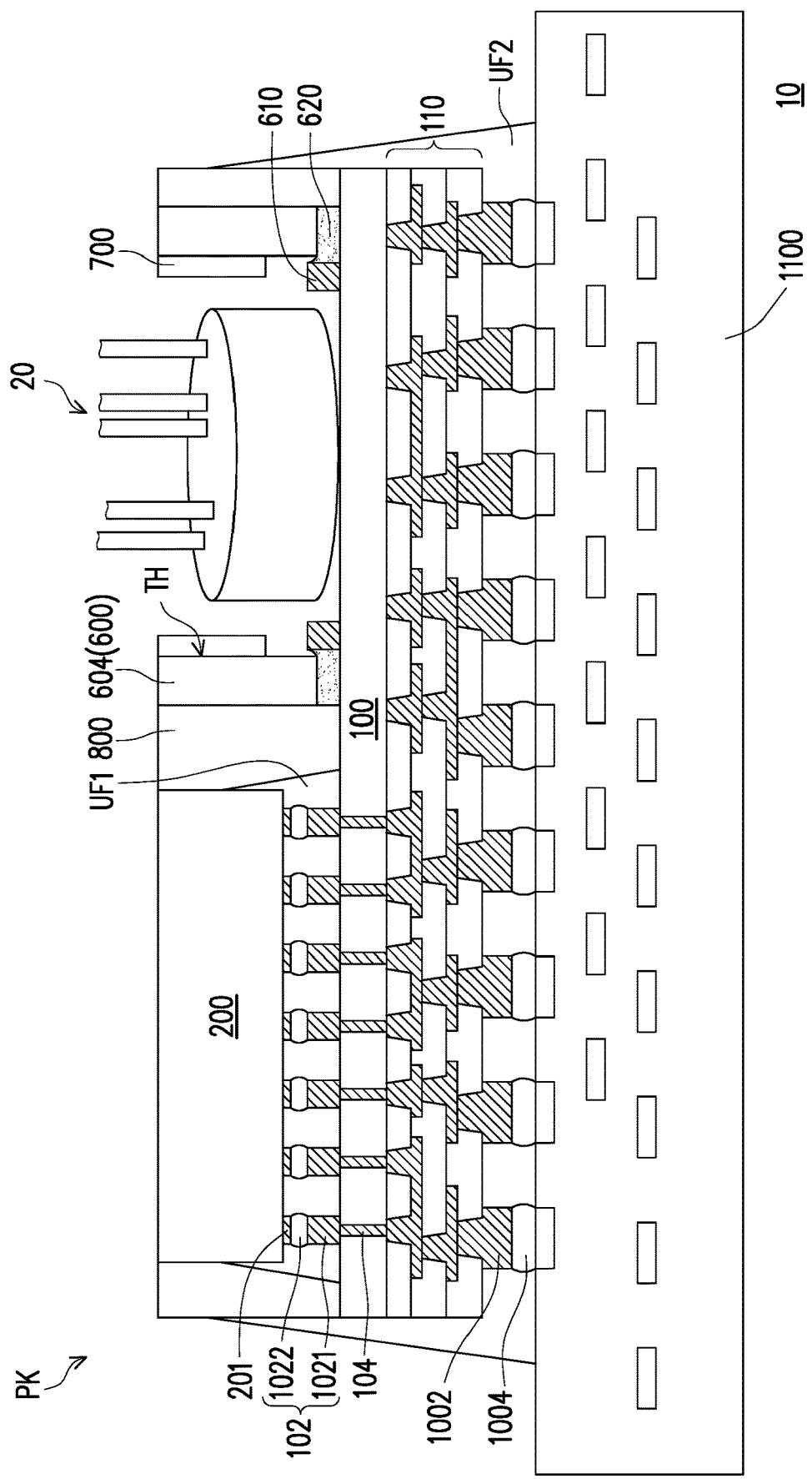

In some embodiments, by removing the inner portion 602 of the dummy die 600 to form the through hole TH, other photonic devices may be placed in the through hole TH for photonic applications. FIG. 13 is a schematic cross-sectional view illustrating an application of the package structure PK in FIG. 12 in accordance with some embodiments of the disclosure. Referring to FIG. 13, for example, a coupler 20 is inserted into the through hole TH of the dummy die 600. That is, the through hole TH may serve as a socket. In some embodiments, the coupler 20 may be an optical coupler, which may include, for example, an optical fiber, a laser emitter, or the like. As mentioned above, the through hole TH exposes the optical device embedded in the first die 100. As such, upon inserting into the through hole TH, the coupler 20 is bonded to the first die 100 and is able to optically communicate with the optical devices in the first die 100, thereby achieving photonic applications. Accordingly, referring to FIG. 13 and FIG. 3, after the lid structure 900 is placed on the substrate 1100, the optical fiber of the coupler 20 is configured to extend out of the lid structure 900 through the openings 930 for further connection.

Figure 14:
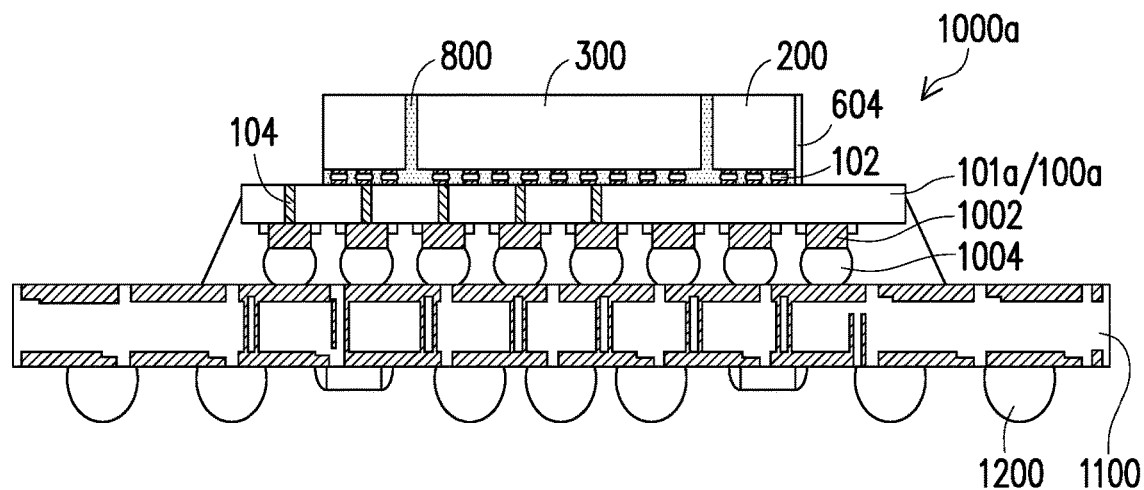
FIG. 14 to FIG. 16 are schematic cross-sectional views illustrating intermediate stages in a manufacturing of a semiconductor package in accordance with some embodiments of the disclosure.
Figure 15:
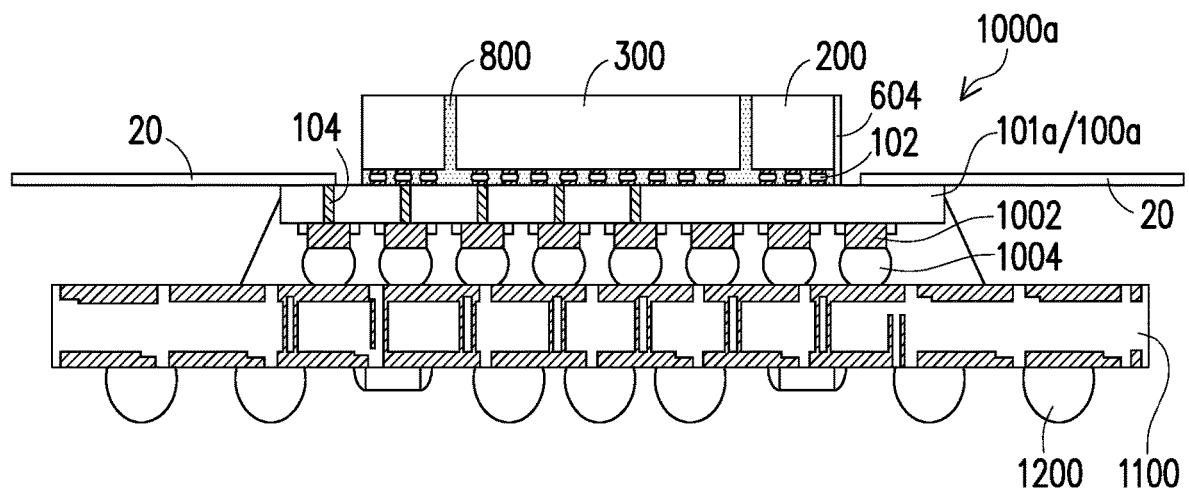
Figure 16:
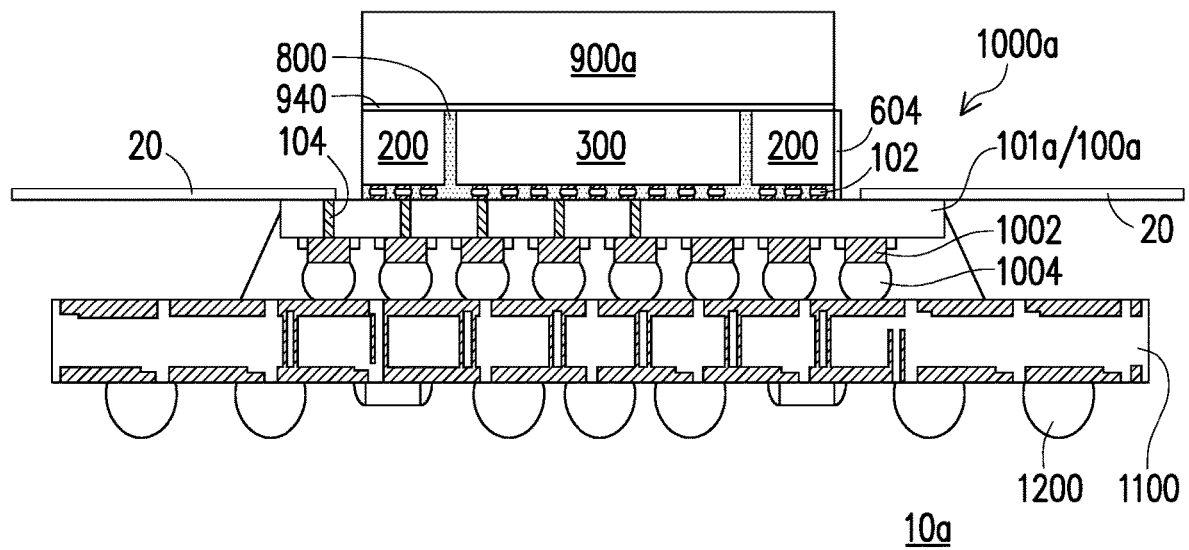

FIG. 14 to FIG. 16 are schematic cross-sectional views illustrating intermediate stages in a manufacturing of a semiconductor package in accordance with some embodiments of the disclosure. There are many different arrangements and manufacturing methods can be applied to the stacked structure of the semiconductor package in the disclosure. FIG. 14 to FIG. 16 merely illustrating another one of the embodiments for manufacturing the semiconductor package 10a shown in FIG. 16.

It is noted that the semiconductor package 10a shown in FIG. 16 contains many features same as or similar to the semiconductor package 10 disclosed earlier with FIG. 1 to FIG. 3. For purpose of clarity and simplicity, detail description of same or similar features may be omitted, and the same or similar reference numbers denote the same or like components.

In accordance with some embodiments of the disclosure, a stacked structure 1000a is provided on a substrate 1100. In some embodiments, the stacked structure 1000a may include a first die 100 disposed over and bonded to the substrate 1100, and a second die 200 disposed over and electrically connected to the first die 100a. In some exemplary embodiments, the first die 100a is integrated in a workpiece 101a, and the second die 200 may be disposed over and bonded to the workpiece 101a and electrically connected to the first die 100a. The workpiece 101a integrated with the first die 100a may be further bonded to the substrate 1100 through conductive terminals 1002, 1004 to form a "CoWoS (Chip on Wafer on Substrate) package". In some embodiments, the workpiece 101a may be a singulated die, such as an interposer die, for example. In other embodiments, the workpiece 101a may be a wafer, such as an interposer wafer, for example. In some embodiments where the workpiece 101a is an interposer wafer or an interposer die, the workpiece 101a includes a semiconductor substrate and interconnects, such as through semiconductor vias (TSV) 104 and lines (not illustrated) within the semiconductor substrate. In some embodiments, the semiconductor substrate of the first die 100a may be made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the semiconductor substrate has a plurality of semiconductor devices (e.g., transistors, capacitors, photodiodes, combinations thereof, or the like) and a plurality of optical devices (e.g. waveguides, filters, photodiodes, light-emitting diodes, combinations thereof, or the like) formed therein. In some embodiments, the interconnects may include one or more conductive materials, such as copper, a copper alloy, silver, gold, tungsten, tantalum, aluminum, a combination thereof, or the like.

In some embodiments, the first die 100a may be a photonic integrated circuit die, which may include a CMOS chip with active and passive optical devices such as waveguides, modulators, photodetectors, optical couplers, combiners, etc. The functionalities supported by the photonic integrated circuit die may include photo-detection, optical modulation, optical routing, and optical interfaces for high-speed I/O and optical power delivery. It should be noted that since the workpiece 101a integrated with the first die 100a serves as a carrier for supporting the second die 200, the workpiece 101a integrated with the first die 100a may be referred to as an "interposer" in some embodiments.

In some embodiments, the second die 200 may be an electronic integrated circuit die. In such embodiments, the photonic integrated circuit die 100 may have the function of receiving optical signals, transmitting the optical signals inside the photonic integrated circuit die 100, transmitting the optical signals out of the photonic integrated circuit die 100, and communicating electronically with the electronic integrated circuit die 200. By incorporating photonics devices in the photonic integrated circuit die 100 and electronic devices in the electronic integrated circuit die 200, the CMOS processes for each chip may be optimized for the type of devices incorporated.

As illustrated in FIG. 14, the second die 200 is placed such that the conductive pads of the second die 200 are attached to a plurality of connectors 102 on the workpiece 101a. For example, the conductive pads of the second die 200 are directly in contact with the corresponding connectors on the workpiece 101a. After the second die 200 is placed on the connectors 102, a reflow process may be performed to fix the conductive pads onto the connectors 102. As such, electrical connection between the second die 200 and the first die 100a may be realized. That is, the connectors 102 are disposed between the workpiece 101a and the second die 200, and the second die 200 is electrically connected to the first die 100a through the connectors 102. In some embodiments, the connectors 102 are referred to as "micro bumps."

In accordance with some embodiments of the present disclosure, a third die 300 may also be bonded to the substrate 1100 and electrically connected to the second die 200. In some embodiments, the third die 300 may be bonded to the substrate 1100 through, for example, the workpiece 101a, and is arranged with the second die 200 on the workpiece 101a in a side by side manner. In some embodiments, the third die 300 may also be bonded to the workpiece 101a through the connectors 102 on the workpiece 101a. After the second die 200 and the third die are placed on the connectors 102, a reflow process may be performed to fix the conductive pads onto the connectors 102. As such, electrical connection between the second die 200 and the third die 300 may be realized. That is, the second die 200 is electrically connected to the third die 300 through the connectors 102. In some embodiments, the connectors 102 are referred to as "micro bumps." In some embodiments, an encapsulation material 800 is formed on the workpiece 101a to encapsulate the second die 200 and the third die 300. In some embodiments, the encapsulation material 800 is a molding compound, a molding underfill, a resin (such as epoxy), or the like. It is noted that such package structure including the workpiece 101a integrated with the first die 100a, the second die 200, the third die 300, and encapsulation material 800 may be referred to as a "stacked structure 1000a" in some embodiments.

In some embodiments, the third die 300 may be a system on chip (SoC), which include CPU, GPU, FPGA or other suitable high performance integrated circuit. In some embodiments, the second die 200 may be the electronic integrated circuit die including a driver die with circuitry for driving the photonics devices in the first die 100a (photonic integrated circuit die). Accordingly, the electronic integrated circuit die 200 may receive electronic signals from the SoC 300 via the photonic integrated circuit die 100 and use the received signals to subsequently drive photonic devices in the photonic integrated circuit die 100. In this manner, the electronic integrated circuit die 200 provides the driver circuitry as opposed to integrating driver circuitry in the SoC 300. However, the exemplary embodiment is not intended to limit the disclosure.

By utilizing the embodiments described herein, the first die (a photonic integrated circuit die, for example) 100 can be integrated within a workpiece 101a such as an interposer. Further, by configuring a third die (a system on chip (SoC), for example) 300, the electrical losses can be minimized, leading to a more efficient final device.

Referring to FIG. 15, in some embodiments, a coupler 20 is bonded to the stacked structure 1000a. In some embodiments, the coupler 20 may be a photonic device including, for example, an optical coupler, an optical fiber, a laser emitter, or the like. In some embodiments, the first die 100a may include an optical input/output portion surrounded by the dam structure 604, and the coupler 20 may be bonded to the optical input/output portion surrounded by the dam structure 604. In some embodiments, the dam structure 604 isolate the coupler 20 from the encapsulation material 800 and exposes the optical input/output portion of the first die 100a. As such, upon bonded to first die, the coupler 20 is able to optically communicate with the optical devices in the first die 100a, thereby achieving photonic applications. In the present embodiment, the optical couplers may be edge couplers, which include a plurality of grooves parallel to one another and extended to an edge of the coupling surface of the first die 100a, and are configured for coupling of light between planar waveguide circuits and optical fibers. The disclosure is not limited thereto. The detailed structure and manufacturing processes of such stacked structure 1000a will be described later in FIG. 17 to FIG. 23.

Then, referring to FIG. 16, FIG. 6, a lid structure 900a is disposed on the substrate 1100. In some embodiments, the lid structure 900a may be attached to the substrate 1100 on a same side as the stacked structure 1000a bonded to, such that the lid structure 900 encloses the stacked structure 1000a. In accordance with some embodiments of the present disclosure, the lid structure 900a is attached to the substrate 1100 through adhesive. In some embodiments, the lid structure 900a surrounds the stacked structure 1000a and covers a top surface of the stacked structure 1000a. In the present embodiment, the lid structure 900a surrounds the stacked structure 1000a, and covers the top surfaces of the second die 200 and the third die 300. In some embodiments, the optical fiber of the coupler 20 penetrates through and extends out of the lid structure 900a.

Figure 17:
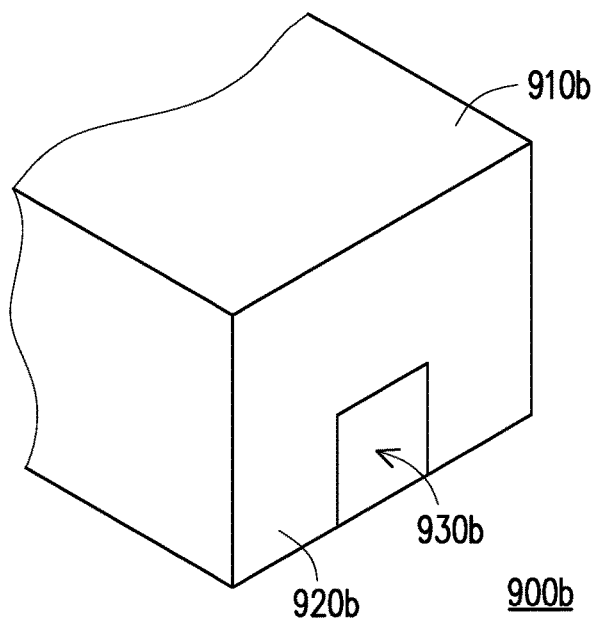
FIG. 17 schematically illustrates a partial perspective view of a lid structure in accordance with some embodiments of the disclosure.

FIG. 17 schematically illustrates a partial perspective view of a lid structure in accordance with some embodiments of the disclosure. In the present embodiments, the lid structures 900a, 900b illustrated in FIG. 6 and FIG. 17 may be applied to the semiconductor package 10a. In the embodiment shown in FIG. 6, the opening 930a is located on the edge of the cover portion 910 and extended toward the side portion 920, so the optical fibers of the coupler 20 may extend out from the top and/or the side of the lid structure 900a depending on the arrangement of the coupler 20. In the present embodiment, the opening 930a forms a slit on the side portion 920, which means the opening 930a is extended from the top of the side portion 920 for connecting the cover portion 910 toward the bottom of the side portion 920. As such, the opening 930a may accommodate variety of formations of couplers 20, such as grating coupler, edge coupler, or the like. In the embodiment shown in FIG. 17, the opening 930b may merely be located on the side portion 920b of the lid structure 900b. For example, the opening 930b may be located on the bottom part of the side portion 920b, and not be extended all the way to the top of the side portion 920b. However, the disclosure is not limited thereto. The location of the opening of the lid structure may be adjusted according to the location and the arrangement of the coupler. Accordingly, a portion (e.g., optical fiber, or the like) of the coupler 20 may extends out of the lid structure through the openings for further connection.

In other embodiments, a thermal interface material 940 may be disposed between the lid structure 900a/900b and the top surface of the stacked structure 1000a (the second die 200 and the third die 300) to further improve the heat dissipation efficiency of the semiconductor package 10a. That is to say, by providing the lid structure 900a/900b on top of the semiconductor package 10a, not only the warpage but the heat dissipation of the semiconductor package 10a can also be improved.

FIG. 18 to FIG. 22 are schematic cross-sectional views illustrating intermediate stages in a manufacturing of a semiconductor package in accordance with some embodiments of the disclosure. There are many different arrangements and manufacturing methods can be applied to the stacked structure of the semiconductor package in the disclosure. FIG. 18 to FIG. 22 merely illustrating one of the embodiments for manufacturing the stacked structure 1000a shown in FIG. 15. It is noted that the third die 300 in FIG.

14 to FIG. 16 are omitted herein for simplicity and clarity purpose. In addition, it should be well understood that the manufacturing processes illustrated in FIG. 18 to FIG. 21 are performed prior to the manufacturing process illustrated in FIG. 14 in order to provide the stacked structure 1000a on the substrate 1100.

It is noted that the structures shown in FIG. 18 to FIG. 22 contain many features same as or similar to the structures disclosed earlier with FIG. 7 to FIG. 13. For purpose of clarity and simplicity, detail description of same or similar features may be omitted, and the same or similar reference numbers denote the same or like components.

Figure 18:
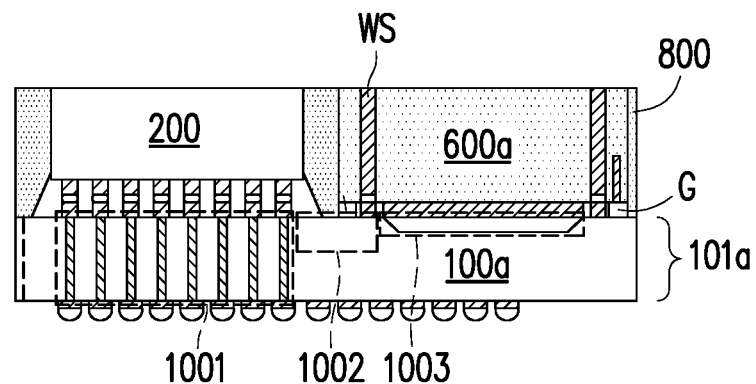
FIG. 18 to FIG. 22 are schematic cross-sectional views illustrating intermediate stages in a manufacturing of a semiconductor package in accordance with some embodiments of the disclosure.

Referring to FIG. 18, in some embodiments, a dummy die 600a and a second die 200 are disposed over a workpiece 101a. In some embodiments, workpiece 101a may be a first die 100a, or an interposer integrated with a first die 100a. In some embodiments, the first die 100a may be, for example, a photonic integrated circuit die, which may include an electrical bonding portion 1001, at least one optical input/output portion 1002 configured to transmit and receive optical signal, and at least one groove 1003 located in the proximity of the at least one optical input/output portion 1002.

In some embodiments, the above-mentioned optical signal is, for example, pulsed light, light with continuous wave (CW) combinations thereof, or the like. In some embodiments, the electrical bonding portions 1001 of the first die 100a may include through semiconductor vias (TSVs), semiconductor devices (e.g., transistors, capacitors and so on), wirings, or other conductors for electrical connection while the optical input/output portions 1002 of the first die 100a may include semiconductor devices and optical devices for processing the optical signal. For example, the semiconductor devices formed in the optical input/output portions 1002 may include transistors, capacitors, photodiodes or the combination thereof, and the optical devices formed in the optical input/output portions 1002 may include edge couplers, modulators, waveguides, filters, or the combination thereof.

As shown in FIG. 18, the workpiece 101a may include an active surface where the electrical bonding portions 1001, the optical input/output portions 1002 and the grooves 1003 of the first die 100a are located. In some embodiments, the grooves 1003 formed on the active surface of the workpiece 101a may be V-grooves formed by etching or other suitable processes. The number of the groove(s) 1003 formed on the first die 100a is not limited in this disclosure.

In some embodiments, after attaching the dummy dies 600a onto the workpiece 101a, the periphery regions of the dummy dies 600a adhere with the workpiece 101a through a glue layers G, and the central region of the dummy dies 600a cover the grooves 1003.

In some embodiments, the second die 200 may be picked-up and placed onto the active surface of the workpiece 101a such that the second die 200 may cover the electrical bonding portions of the first die 100a. After the second die 200 is picked-up and placed onto the workpiece 101a, the active surface of the second die 200 may face the workpiece 101a and the second die 200 may be bonded to the workpiece 101a through conductive terminals, e.g. micro bumps.

In some embodiments, the attachment of the dummy die 600a is performed prior to the bonding of the second die 200. In some alternative embodiments, the bonding of the second die 200 is performed prior to the attachment of the dummy die 600a.

Referring to FIG. 18, an underfills UF1 may be formed between the second die 200 and the workpiece 101a so as to laterally encapsulate the conductive terminals therebetween. The underfills UF1 not only protects the conductive terminals from fatigue but also enhances bonding reliability between the second die 200 and the workpiece 101a. In some embodiments, the material of the glue layer G and the underfills UF1 may be a thermally curable polymer and may be cured simultaneously by thermal curing process. In some other embodiments, the formation of the underfill UF1 may be omitted.

Although the bonding and electrical connection (shown in FIG. 18) between the second die 200 and the workpiece 101a is achieved by micro bumps encapsulated by the underfill UF1, the bonding and electrical connection between the second die 200 and the workpiece 101a of this disclosure is not limited thereto. Other suitable chip-to-wafer bonding processes (e.g., a chip-to-wafer hybrid bonding process) may be utilized.

In some embodiments, an encapsulation material 800 is formed on the workpiece 101a to encapsulate the dummy die 600a, the second die 200, the underfill UF1, and the glue layers G. In some embodiments, the encapsulation material 800 may be formed by an over-mold process followed by a grinding process. During the over-mold process, the encapsulation material 800 is formed on the workpiece 101a to encapsulate the second die 200, the underfill UF1 and the glue layers G such that the second die 200, the underfill UF1 and the glue layers G are not revealed. Then, the encapsulation material 800 is ground or polished until the back surface of the second die 200 and the back surface of the dummy die 600a are exposed. After performing the grinding process, a polished encapsulation material 800 laterally encapsulating the dummy die 600a and the second die 200 is formed over the workpiece 101a. The above-mentioned grinding process of the encapsulation material 800 may be a chemical mechanical polishing (CMP) process, a mechanical grinding process, combinations thereof or other suitable processes.

In some embodiments, the structures of the dummy die 600a and the second die 200 to be disposed on the workpiece 101a may be similar to the structures of the dummy die 600 and the second die 200 shown in FIG. 7. Then, a grinding process is applied, so that not only the top portion of the encapsulation material 800 is removed, but also a top portions of the second die 200 and the dummy dies 600a are removed. After performing such grinding process, the wall structures WS are revealed from the back surface of the dummy die 600a as shown in FIG. 18. The above-mentioned grinding process may be a chemical mechanical polishing (CMP) process, a mechanical grinding process, combinations thereof or other suitable processes.

Figure 19:
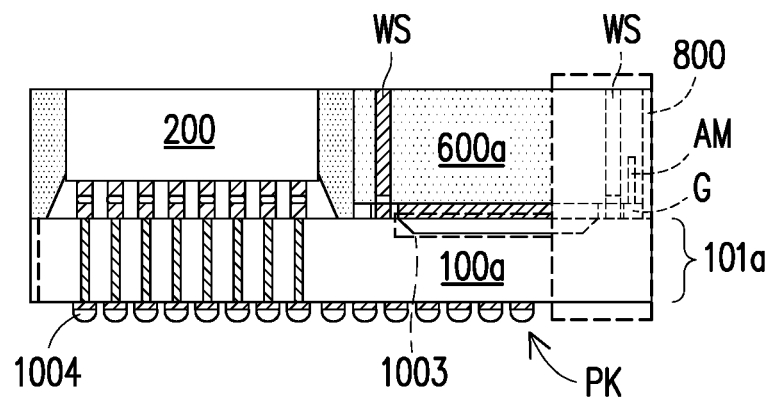

Referring to FIG. 19, a singulation process is performed to singulate the wafer level structure illustrated in FIG. 18 into a plurality of singulated package structure PK. Portions of the encapsulation material 800, portions of the dummy die 600a, and portions of the glue layers G may be removed by the singulation process. As illustrated in FIG. 19, the alignment marks AM, portions of the wall structures WS, portions of the central regions of the dummy die 600a, and portions of the periphery regions of the dummy dies 600a may be removed by the singulation process. After performing the singulation process, an end of the groove 1003 are accessibly exposed from a sidewall of the package structure PK.

Figure 20:
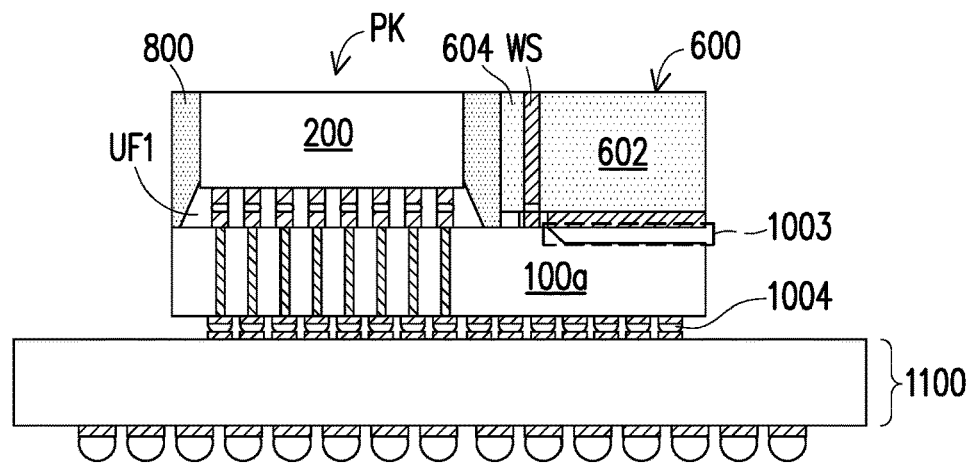

Referring to FIG. 20, after performing the singulation process, one of the package structure PK is picked-up and placed on a substrate 1100. The conductive bumps 1004 of the package structure PK are electrically connected to wirings of the substrate 1100. In some embodiments, the substrate 1100 may be a printed circuit board including a plurality of conductive balls 1200 (e.g., solder balls or the like) formed on the bottom surface thereof. In other words, the substrate 1100 is a ball grid array (BGA) circuit substrate, but the disclosure is not limited thereto.

Figure 21:
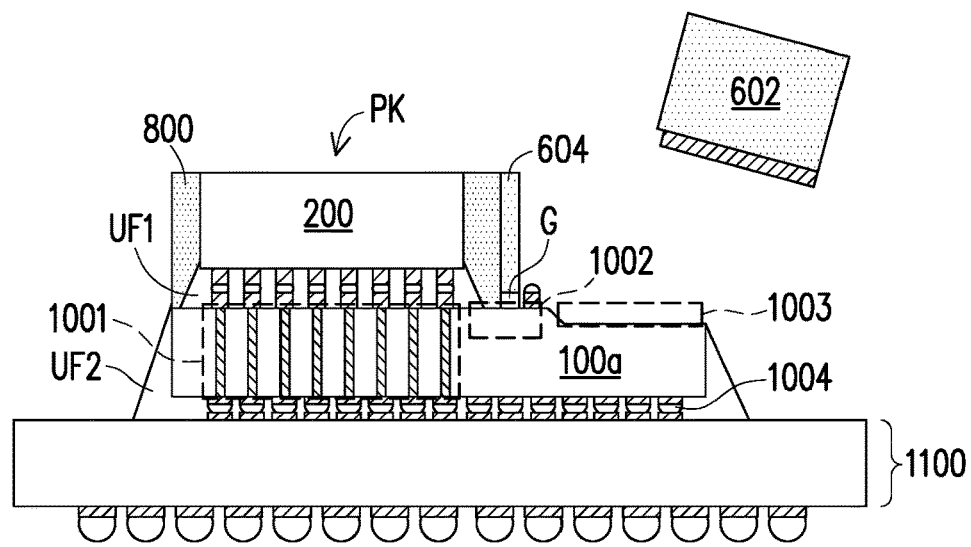

Referring to FIG. 21, after bonding the package structure PK with the substrate 1100, an ablation process is performed to remove the wall structure WS embedded in the dummy die 600a such that the inner portion 602 of the dummy die 600a are peeled from the outer portion 604 of the dummy die 600a and the first die 100a. In some embodiments, the ablation process is a laser ablation process for partially or entirely removing the wall structure WS. After removing the wall structure WS between the outer portion 604 and the inner portion 602 of the dummy die 600a, the inner portion 602 of the dummy die 600a may be picked-up and removed to such that the groove 1003 on the first die 100a are revealed. The outer portion 604 may serve as a dam structure, e.g. a semiconductor (silicon) dam, for confining the distribution of the encapsulation material 800. The dam structure 604 is electrically floated, for example. After removing the inner portion 602 of the dummy die 600a, a Chip-on-Wafer-on-Substrate (CoWoS) package 10a is accomplished.

In some embodiments, an underfill UF2 may be formed between the package structure PK and the substrate 1100 to laterally encapsulate the workpiece 101a and the conductive bumps 1004. In some alternative embodiments, the formation of the underfill UF2 may be omitted.

Figure 22:
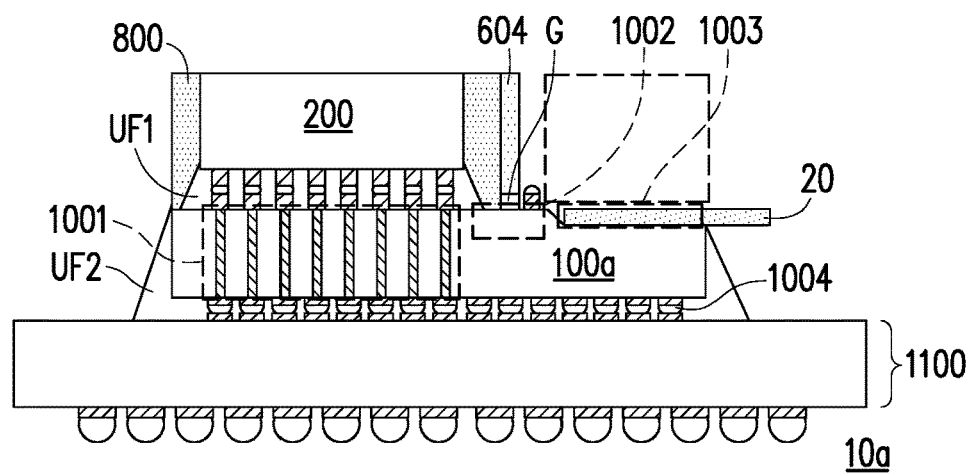

Referring to FIG. 22, after removing the inner portion 602 of the dummy die 600a, a coupler 20 is provided and assembled in the groove 1003. In some embodiments, the coupler 20 may be a photonic device including, for example, an optical coupler, an optical fiber, a laser emitter, or the like. In some embodiments, the coupler 20 is laterally inserted into the groove 1003. The optical fiber portion of the coupler 20 extends laterally along the groove 1003 and is optically coupled to the optical input/output portion 1002 of the first die 100a. Since the coupler 20 assembled in the groove 1003 extends laterally, the optical fiber portion of the coupler 20 may be extended out of the lid structure, e.g. the lid structure 900a/900b shown in FIG. 6 and FIG. 17, from the opening 930a/930b on the side portion 920a/920b.

Owing to the arrangement of the lid structure bonded to the substrate and covering the top surface of the stacked structure, warpage of the substrate and the attached stacked structure may be prevented or at least significantly improved. In addition, the optical fiber portion of the coupler may extends out of the lid structure through the openings for further connection. In some embodiments, the lid structure may be in physical contacts with the top surfaces of the second die (and the third die). In other embodiments, a thermal interface material may be disposed between the lid structure and the top surface of the second die (and the third die) to further improve the heat dissipation efficiency of the semiconductor package. That is to say, by providing the lid structure on top of the semiconductor package, not only the warpage but the heat dissipation of the semiconductor package can also be improved.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the present disclosure, a semiconductor package includes a substrate, a stacked structure, an encapsulation material, a lid structure, and a coupler. The stacked structure is disposed over and bonded to the substrate. The encapsulation material partially encapsulates the stacked structure. The lid structure is disposed on the substrate, wherein the lid structure surrounds the stacked structure and covers a top surface of the stacked structure. The coupler is bonded to the stacked structure, wherein a portion of the coupler penetrates through and extends out of the lid structure.

In accordance with some embodiments of the present disclosure, a semiconductor package includes a substrate, a workpiece integrated with a first die and bonded to the substrate, a second die, a lid structure, and a coupler. The second die is disposed over and bonded to the workpiece, wherein the second die is electrically connected to the first die. The lid structure is disposed on the substrate, wherein the lid structure surrounds the workpiece with the first die and the second die, and covers a top surface of the second die. The coupler is bonded to the first die, wherein a portion of the coupler penetrates through and extends out of the lid structure.

In accordance with some embodiments of the present disclosure, an integrated optical communication system includes a substrate, a photonic integrated circuit die, an electronic integrated circuit die, an encapsulation material, a lid structure, and an optical coupler. The photonic integrated circuit die is disposed on the substrate. The electronic integrated circuit die is disposed over the substrate and electrically connected to the photonic integrated circuit die. The encapsulation material laterally encapsulates the electric integrated circuit die. The lid structure is disposed on the substrate, wherein the lid structure surrounds the photonic integrated circuit die and the electronic integrated circuit die and covers a top surface of the electronic integrated circuit die. The optical coupler is bonded to the photonic integrated circuit die, wherein an optical fiber portion of the optical coupler penetrates through and extends out of the lid structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
a substrate;
a stacked structure disposed over and bonded to the substrate, wherein the stacked structure comprises a first die disposed on the substrate, and a second die disposed over and electrically connected to the first die;
an encapsulation material laterally encapsulating the second die, wherein a side surface of the first die is free of the encapsulation of the encapsulation material;
a lid structure disposed on the substrate and covering the stacked structure, wherein the lid structure comprises an opening extending from a top of a sidewall of the lid structure toward a bottom of the sidewall of the lid structure, and the side wall laterally surrounds the stacked structure; and a coupler bonded to the stacked structure, wherein a portion of the coupler extends out of the lid structure through the opening.

2. The semiconductor package as claimed in claim 1, further comprising an underfill disposed between the substrate and the stacked structure.

3. The semiconductor package as claimed in claim 1, wherein the first die comprises a photonic integrated circuit die, the second die comprises an electronic integrated circuit die, and the coupler comprises an optical coupler bonded to the photonic integrated circuit die, and an optical fiber of the optical coupler penetrates through and extends out of the lid structure.

4. The semiconductor package as claimed in claim 3, wherein the photonic integrated circuit die comprising an optical input/output portion and a groove located adjacent to the optical input/output portion, and the optical fiber is partially located within the groove and optically coupled to the optical input/output portion.

5. The semiconductor package as claimed in claim 1, wherein the lid structure comprises an opening extending through the lid structure, and the portion of the coupler extends out of the lid structure through the opening.

6. The semiconductor package as claimed in claim 5, wherein the lid structure further comprises a side portion surrounding the stacked structure, and a cover portion connecting the side portion and covering a top surface of the stacked structure, and the opening is located on the cover portion or the side portion.

7. The semiconductor package as claimed in claim 5, wherein the lid structure further comprises a side portion surrounding the stacked structure, and a cover portion connecting the side portion and covering a top surface of the stacked structure, and the opening is located in the cover portion and extended into and located adjacent to the side portion.

8. The semiconductor package as claimed in claim 1, further comprises a thermal interface material disposed between the lid structure and a top surface of the stacked structure.

9. The semiconductor package as claimed in claim 1, further comprises a system on chip disposed over and bonded to the substrate, wherein the lid structure surrounds the system on chip and covers a top surface of the system on chip.

10. A semiconductor package comprising:
a substrate;
a semiconductor substrate integrated with a first die and bonded to the package substrate, wherein the workpiece comprises a plurality of through vias extending through a semiconductor substrate of the workpiece;
a second die disposed over and bonded to the semiconductor substrate, wherein the second die is electrically connected to the first die;
an encapsulation material laterally encapsulating the second die;
a lid structure disposed on the substrate and covering the workpiece and the second die; and
a coupler bonded to the first die, wherein a portion of the coupler penetrates through and extends out of the lid structure; and
a semiconductor dam structure disposed on the first die and located between the coupler and the encapsulation material.

11. The semiconductor package as claimed in claim 10, wherein the lid structure comprises an opening extending through the lid structure, and the portion of the coupler extends out of the lid structure through the opening.

12. The semiconductor package as claimed in claim 11, wherein the lid structure further comprises a side portion surrounding the workpiece with the first die and the second die, and a cover portion connecting the side portion and covering a top surface of the second die, and the opening is located on the cover portion or the side portion.

13. The integrated optical communication system as claimed in claim 11, wherein the lid structure further comprises a side portion surrounding the photonic integrated circuit die and the electronic integrated circuit die, and a cover portion connecting the side portion and covering a top surface of the electronic integrated circuit die, and the opening is located on the cover portion and extended toward the side portion.

14. The semiconductor package as claimed in claim 10, wherein the first die comprises a photonic integrated circuit die, the second die comprises an electronic integrated circuit die, and the coupler comprises an optical coupler bonded to the photonic integrated circuit die, and an optical fiber of the optical coupler penetrates through and extends out of the lid structure.

15. An integrated optical communication system comprising:
a substrate;
a photonic integrated circuit die disposed on the substrate;
an electronic integrated circuit die disposed over the substrate and electrically connected to the photonic integrated circuit die;
an encapsulation material laterally encapsulating the electronic integrated circuit die;
a lid structure bonded to the substrate and covering the photonic integrated circuit die and the electronic integrated circuit die, wherein the lid structure comprises a side portion surrounding the photonic integrated circuit die and a cover portion covering a top surface of the electronic integrated circuit die, and an opening extending through both the cover portion and the side portion; and
an optical coupler bonded to the photonic integrated circuit die, wherein an optical fiber portion of the optical coupler extends out of the lid structure through the opening.

16. The integrated optical communication system as claimed in claim 15, wherein the lid structure comprises an opening extending through the lid structure, and the optical fiber portion extends out of the lid structure through the opening.

17. The integrated optical communication system as claimed in claim 16, wherein the lid structure further comprises a side portion surrounding the photonic integrated circuit die and the electronic integrated circuit die, and a cover portion connecting the side portion and covering a top surface of the electronic integrated circuit die, and the opening is located on the cover portion or the side portion.

18. The integrated optical communication system as claimed in claim 16, wherein the lid structure further comprises a side portion surrounding the photonic integrated circuit die and the electronic integrated circuit die, and a cover portion connecting the side portion and covering a top surface of the electronic integrated circuit die, and the opening is located on the cover portion and extended toward the side portion.

19. The integrated optical communication system as claimed in claim 15, further comprises a thermal interface material disposed between the lid structure and a top surface of the electronic integrated circuit die.

20. The integrated optical communication system as claimed in claim 15, further comprises a system on chip disposed over and bonded to the substrate, wherein the lid structure surrounds the system on chip and covers a top surface of the system on chip.

\* \* \* \* \*